(12) United States Patent
Katayama

(10) Patent No.: US 11,527,276 B2
(45) Date of Patent: Dec. 13, 2022

(54) SEMICONDUCTOR STORAGE DEVICE

(71) Applicant: KIOXIA CORPORATION, Tokyo (JP)

(72) Inventor: Akira Katayama, Yokohama Kanagawa (JP)

(*) Notice: Subject to any disclaimer, the term of this patent is extended or adjusted under 35 U.S.C. 154(b) by 287 days.

(21) Appl. No.: 17/005,149

(22) Filed: Aug. 27, 2020

(65) Prior Publication Data

US 2021/0201973 A1    Jul. 1, 2021

(30) Foreign Application Priority Data

Dec. 27, 2019  (JP) .............................. JP2019-237916

(51) Int. Cl.
*G11C 11/16* (2006.01)
*H01L 27/22* (2006.01)

(52) U.S. Cl.
CPC ........ *G11C 11/1673* (2013.01); *G11C 11/161* (2013.01); *H01L 27/222* (2013.01)

(58) Field of Classification Search
None
See application file for complete search history.

(56) References Cited

U.S. PATENT DOCUMENTS

| 10,283,197 | B1 | 5/2019 | Kim et al. |
| 2006/0092734 | A1 | 5/2006 | Tsuchida et al. |
| 2016/0064058 | A1* | 3/2016 | Janesky ................. G11C 29/12 365/158 |
| 2018/0277188 | A1* | 9/2018 | Fujino ...................... G11C 7/06 |

FOREIGN PATENT DOCUMENTS

JP    2006127672 A    5/2006

* cited by examiner

*Primary Examiner* — Tan T. Nguyen
(74) *Attorney, Agent, or Firm* — Kim & Stewart LLP

(57) ABSTRACT

A semiconductor storage device includes a memory cell including a switching element and a variable resistance element, and a circuit for switching the memory cell ON, performing a first read operation on the memory cell, generating a first voltage based on the first read operation, switching the memory cell ON after first data is written to the memory cell, performing a second read operation while the memory cell is maintained to be ON when the first data is stored in the memory cell during the first read operation, performing the second read operation after the memory cell transitions from ON to OFF at least once when second data is stored in the memory cell during the first read operation, generating a second voltage based on the second read operation, and determining the data stored in the memory cell during the first read operation based on the first and second voltages.

20 Claims, 31 Drawing Sheets

SUB-MEMORY CELL ARRAY 1110

| | CHANGE IN RESISTANCE STATE OF MEMORY CELL MC | COMPARISON OF VOLTAGE VNX OF NODE NX AND VOLTAGE Vhold |
|---|---|---|
| Case 1 | LOW RESISTANCE → LOW RESISTANCE | Vhold=VNX |
| Case 2 | LOW RESISTANCE → HIGH RESISTANCE | Vhold<VNX |
| Case 3 | HIGH RESISTANCE → LOW RESISTANCE | Vhold>VNX |
| Case 4 | HIGH RESISTANCE → HIGH RESISTANCE | Vhold=VNX |

SEMICONDUCTOR STORAGE DEVICE

CROSS-REFERENCE TO RELATED APPLICATION

This application is based upon and claims the benefit of priority from Japanese Patent Application No. 2019-237916, filed Dec. 27, 2019, the entire contents of which are incorporated herein by reference.

FIELD

Embodiments described herein relate generally to a semiconductor storage device.

BACKGROUND

Magnetic random access memory (MRAM) is a memory device that uses magnetic elements having a magnetoresistive effect, in memory cells that store information, and is gaining attention as a next-generation memory device with high-speed operation, large capacity, and nonvolatility. Further, MRAM is being researched and developed as a replacement for volatile memories such as DRAM and SRAM. In this case, it is desirable to operate the MRAM according to the same specifications as the DRAM and SRAM in order to reduce the development cost and to smoothly replace the DRAM and SRAM.

DETAILED DESCRIPTION

Figure 1:
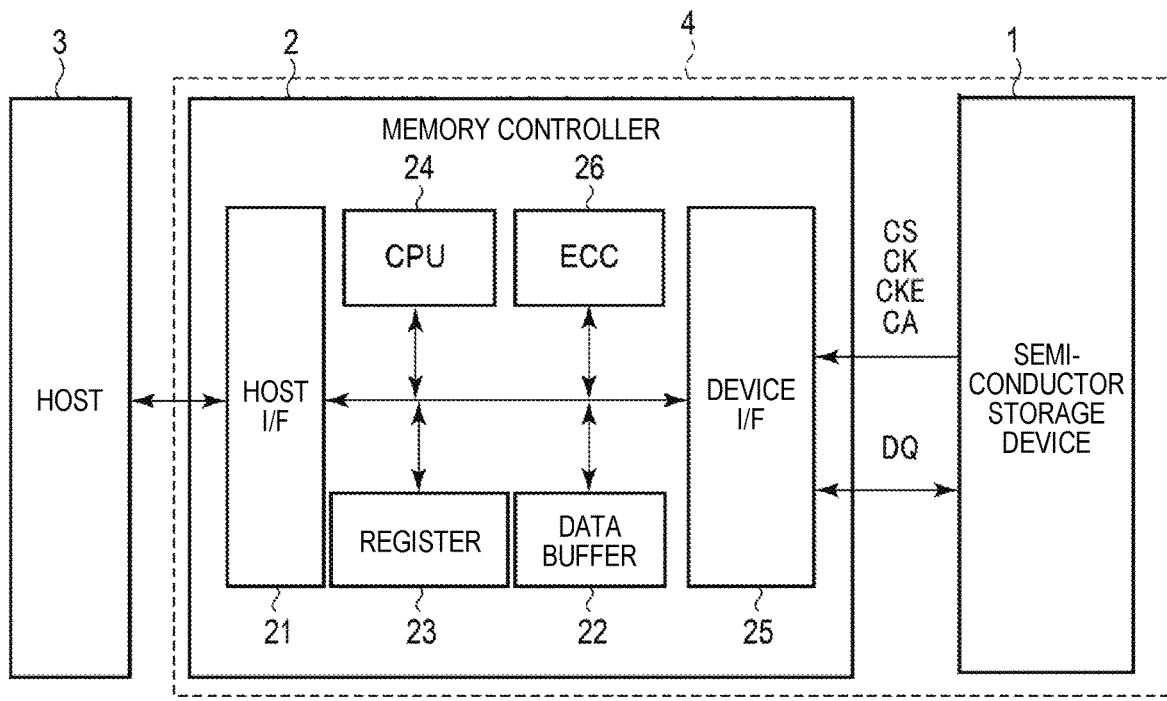
FIG. 1 is a block diagram showing a basic configuration of a memory system including a semiconductor storage device according to a first embodiment.

Embodiments provide a high-quality semiconductor storage device.

In general, according to one embodiment, a semiconductor storage device includes a memory cell including a switching element and a variable resistance element, and a first circuit configured to perform a read operation on the memory cell by switching the memory cell to an ON state, performing a first read operation on the memory cell that has been switched to the ON state, generating a first voltage based on the first read operation, switching the memory cell to the ON state after first data is written to the memory cell on which the first read operation has been performed, performing a second read operation while maintaining the memory cell in the ON state when the first data is stored in the memory cell during the first read operation, performing the second read operation after the memory cell transitions from the ON state to an OFF state at least once when second data different from the first data is stored in the memory cell during the first read operation, generating a second voltage based on the second read operation, and determining the data stored in the memory cell during the first read operation based on the first voltage and the second voltage.

Hereinafter, embodiments will be described with reference to drawings. In the following description, components having substantially the same functions and configurations are denoted by the same reference numerals.

It should be noted that the drawings are schematic and the relationship between the thickness and the plane dimension, the ratio of the thickness of each layer, and the like are different from actual ones. Therefore, specific thicknesses and dimensions should be determined in consideration of the following description. Further, the drawings may include portions in which dimensional relationships and ratios are different from each other.

<1> First Embodiment

<1-1> Configuration
<1-1-1> Configuration of Memory System

The basic configuration of a memory system including a semiconductor storage device according to a first embodiment will be schematically described with reference to FIG. 1. FIG. 1 is a block diagram showing the basic configuration of the memory system including the semiconductor storage device according to the first embodiment. As shown in FIG. 1, a memory system 4 includes a semiconductor storage device 1 and a memory controller 2.

<1-1-2> Configuration of Memory Controller

The memory controller 2 receives a command from a host such as a personal computer, reads data from the semiconductor storage device 1, and writes data to the semiconductor storage device 1.

As shown in FIG. 1, the memory controller 2 includes a host interface (I/F)) 21, a data buffer 22, a register 23, a CPU 24, and a device interface (I/F) 25, and an ECC circuit 26.

The host interface 21 is connected to the host 3. Data transmission/reception and the like are performed between the host 3 and the memory system 4 via the host interface 21.

The data buffer 22 is connected to the host interface 21. The data buffer 22 receives the data transmitted from the host 3 to the memory system 4 via the host interface 21 and temporarily stores the data. The data buffer 22 also temporarily stores data transmitted from the memory system 4 to the host 3 via the host interface 21. The data buffer 22 may be a volatile memory or a nonvolatile memory.

The register 23 stores setting information, commands, status, and the like executed by the CPU 24. The register 23 may be a volatile memory or a nonvolatile memory.

The CPU 24 controls the entire operation of the memory system 4. The CPU 24 executes predetermined processing for the semiconductor storage device 1 according to a command received from the host 3, for example.

The device interface 25 transmits and receives various signals and the like between the memory controller 2 and the semiconductor storage device 1.

The ECC circuit 26 receives write data received from the host 3 via the data buffer 22. Then, the ECC circuit 26 adds an error correction code to the write data. The ECC circuit 26 supplies the write data with the error correction code to, for example, the data buffer 22 or the device interface 25.

The ECC circuit 26 also receives the data supplied from the semiconductor storage device 1 via the device interface 25. The ECC circuit 26 determines whether or not there is an error in the data received from the semiconductor storage device 1. When determining that the received data has an error, the ECC circuit 26 performs error correction processing on the received data by using the error correction code. Then, the ECC circuit 26 supplies the error-corrected data to, for example, the data buffer 22 and the device interface 25.

<1-1-3> Semiconductor Storage Device

Figure 2:
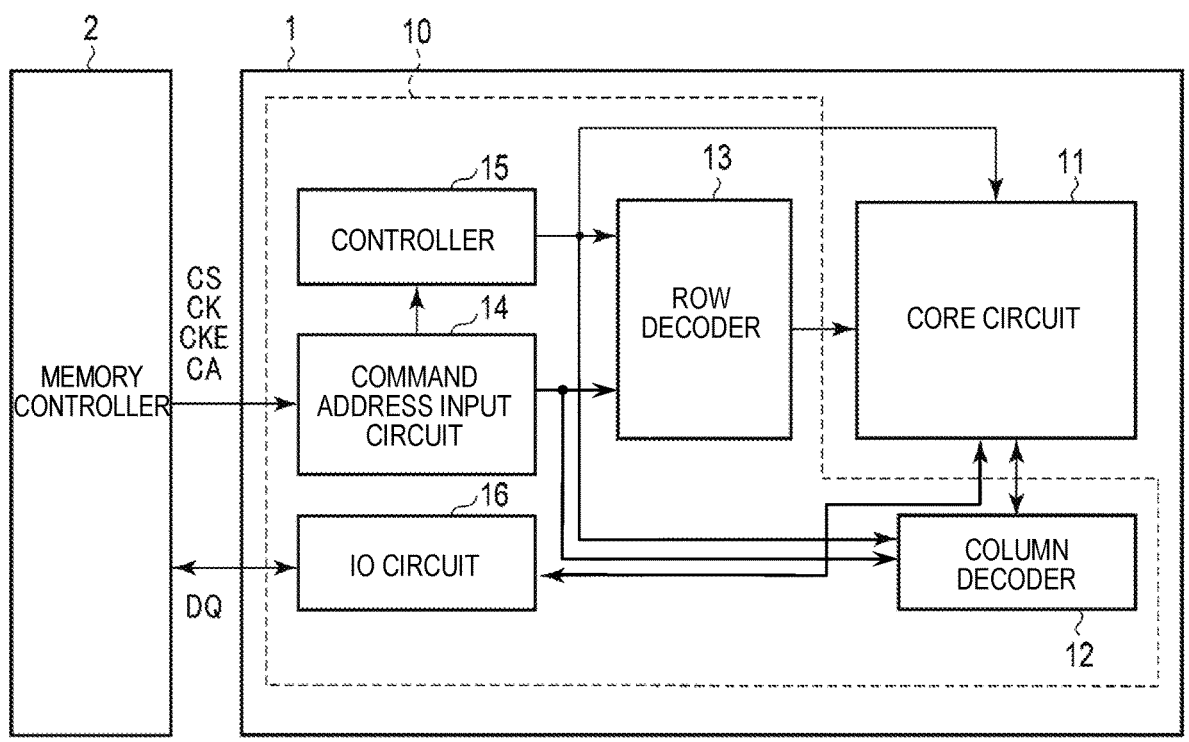
FIG. 2 is a block diagram showing a basic configuration of the semiconductor storage device according to the first embodiment.

The basic configuration of the semiconductor storage device 1 according to the first embodiment will be schematically described with reference to FIG. 2. FIG. 2 is a block diagram showing the basic configuration of the semiconductor storage device 1 according to the first embodiment.

As shown in FIG. 2, the semiconductor storage device 1 according to the first embodiment includes a peripheral circuit 10 and a core circuit 11.

The peripheral circuit 10 includes a column decoder 12, a row decoder 13, a command address input circuit 14, a controller 15, and an IO circuit 16.

The column decoder 12 recognizes a command or an address in a command address signal CA received from an external device, and controls selection of bit lines BL (global bit line and local bit line described later).

The row decoder 13 decodes the address of the command address signal CA supplied from the command address input circuit 14. More specifically, the row decoder 13 is configured to apply a voltage to selected source lines SL (global source line and local source line described later) based on the decoded row address when reading or writing data.

Various external control signals such as a chip select signal CS, a clock signal CK, a clock enable signal CKE, and a command address signal CA are input to the command address input circuit 14 from the memory controller 2. The command address input circuit 14 transfers the command address signal CA to the controller 15.

The controller 15 distinguishes between commands and addresses. The controller 15 controls the semiconductor storage device 1.

The IO circuit 16 temporarily stores the input data input from the memory controller 2 via a data line DQ or the output data read from the core circuit 11. The input data is written in the core circuit 11.

<1-1-4> Core Circuit

Figure 3:
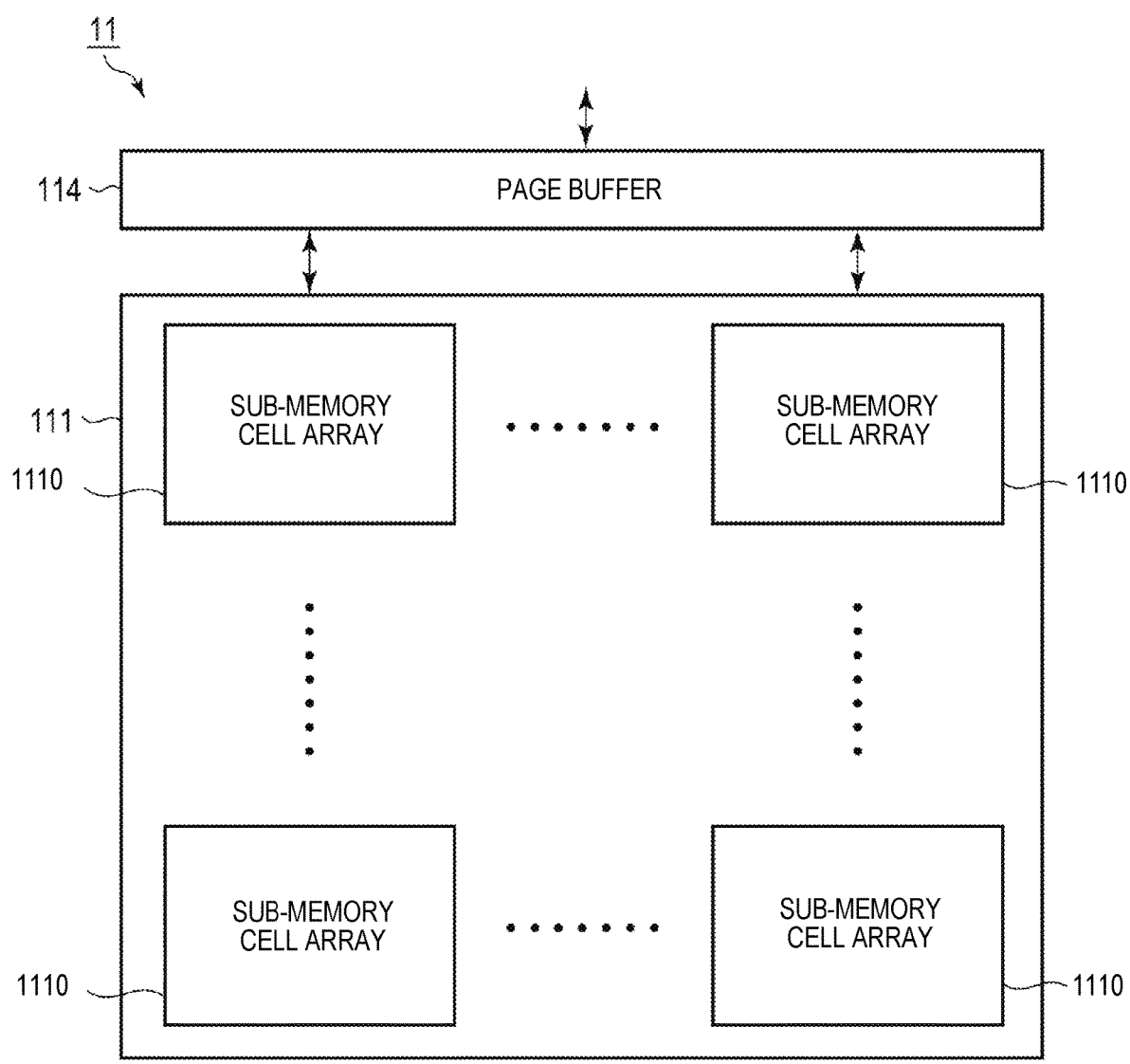
FIG. 3 is a block diagram showing a basic configuration of a core circuit of the semiconductor storage device according to the first embodiment.

The basic configuration of the core circuit 11 of the semiconductor storage device 1 according to the first embodiment will be schematically described with reference to FIG. 3. FIG. 3 is a block diagram showing the basic configuration of the core circuit 11 of the semiconductor storage device 1 according to the first embodiment.

As shown in FIG. 3, the core circuit 11 includes a memory cell array 111 and a page buffer 114.

The memory cell array 111 includes a plurality of sub-memory cell arrays 1110 arranged in a matrix configuration. The sub-memory cell array 1110 is composed of a plurality of memory cells MC arranged in a matrix configuration. The sub-memory cell array 1110 is provided with a plurality of global bit lines GBL and a plurality of local bit lines LBL, and a plurality of global source lines GSL and local source lines LSL. One column of the sub-memory cell array 1110 is connected to one local bit line LBL, and one row of the sub-memory cell array 1110 is connected to one local source line LSL.

The memory cell MC is composed of a magnetic tunnel junction (MTJ) element and a selector. One end of the memory cell MC is connected to the local bit line LBL, and the other end is connected to the local source line LSL.

The page buffer 114 temporarily stores the data read from the memory cell array 111 or the write data received from the memory controller 2. Writing of data to the memory cell array 111 is performed in units of a plurality of memory cells (e.g., page units).

<1-1-5> Memory Cell Array

Figure 4:
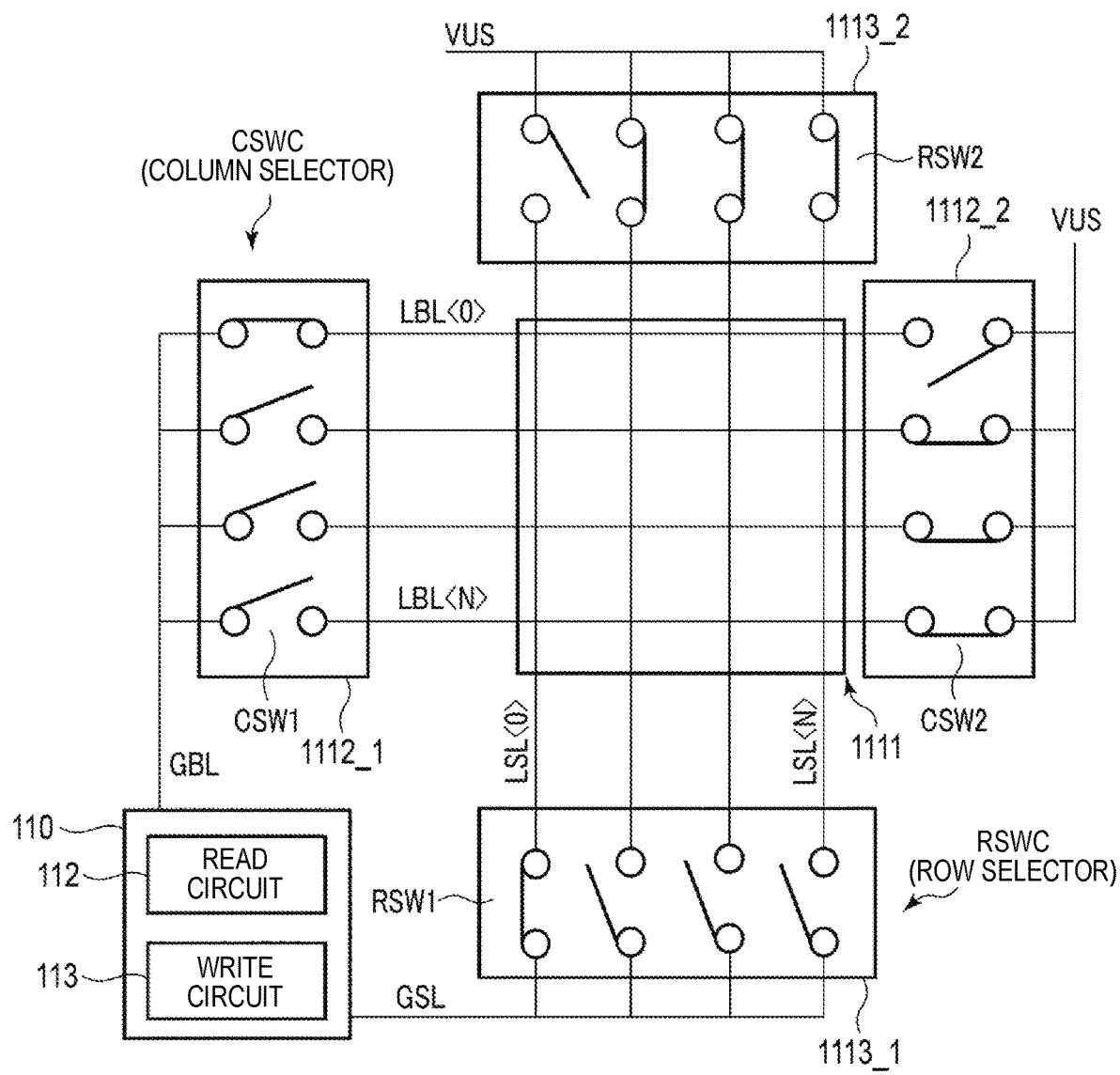
FIG. 4 is a block diagram showing a basic configuration of a memory cell array of the semiconductor storage device according to the first embodiment.

Next, the sub-memory cell array 1110 of the semiconductor storage device 1 according to the first embodiment will be described in more detail with reference to FIG. 4. FIG. 4 is a block diagram showing the basic configuration of the sub-memory cell array 1110 of the semiconductor storage device 1 according to the first embodiment.

As shown in FIG. 4, the sub-memory cell array 1110 includes an access circuit 110, a MAT 1111, column switch circuits (CSWC) 1112_1 and 1112_2, and row switch circuits (RSWC) 1113_1 and 1113_2.

The access circuit 110 includes a read circuit 112 and a write circuit 113.

The read circuit 112 is connected to the local bit line LBL via the global bit line GBL and detects the current flowing in the memory cell MC to read the data stored in the memory cell MC.

The write circuit 113 is connected to the local bit line LBL via the global bit line GBL or to the local source line LSL via the global source line GSL and writes data by passing a current through the memory cell MC.

Data exchange between the read circuit 112 and the write circuit 113 and the data line DQ is performed via the page buffer 114 and the IO circuit 16.

The MAT 1111 includes a plurality of memory cells MC arranged in a matrix configuration on a semiconductor substrate. Details will be described later.

The column switch circuits 1112_1 and 1112_2 control the connection between the global bit line GBL and the local bit line LBL based on the signal from the column decoder 12. More specifically, the column switch circuit 1112_1 includes a plurality of switches CSW1. The switch CSW1 controls the connection between the global bit line GBL and the local bit line LBL. Further, the column switch circuit 1112_2 includes a plurality of switches CSW2. The switch CSW2 controls the supply of a voltage VUS to the local bit line LBL.

The row switch circuits 1113_1 and 1113_2 control the connection between the global source line GSL and the local source line LSL based on the signal from the controller 15. More specifically, the row switch circuit 1113_1 includes a plurality of switches RSW1. The switch RSW1 controls the connection between the global source line GSL and the local source line LSL. Further, the row switch circuit 1113_2 includes a plurality of switches RSW2. The switch RSW2 controls the supply of the voltage VUS to the local source line LSL.

<1-1-6> Read Circuit

Figure 5:
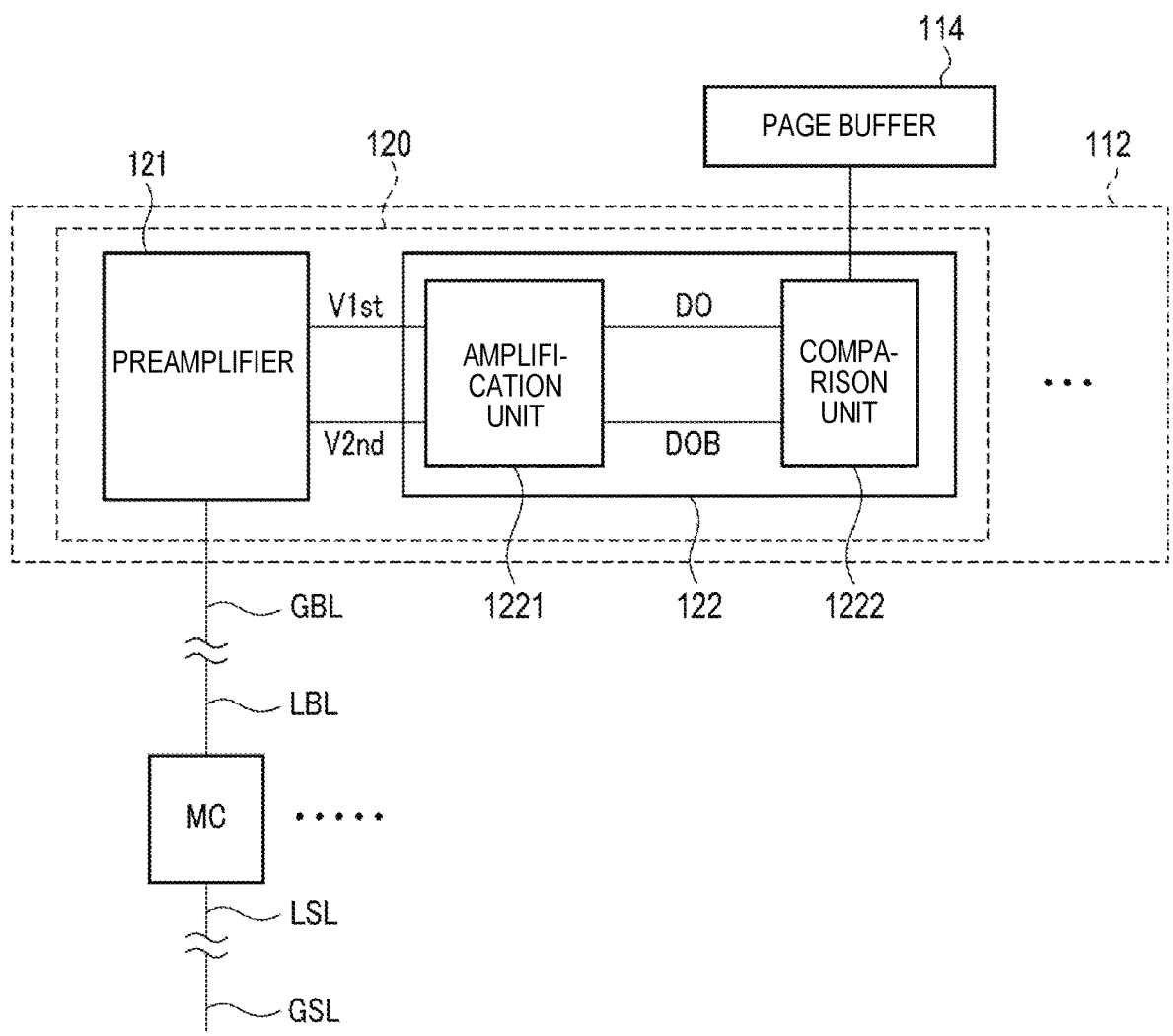
FIG. 5 is a block diagram showing a basic configuration of a read circuit of the semiconductor storage device according to the first embodiment.

The read circuit 112 of the semiconductor storage device 1 according to the first embodiment will be described with reference to FIG. 5. FIG. 5 is a block diagram showing the basic configuration of the read circuit 112 of the semiconductor storage device 1 according to the first embodiment.

As shown in FIG. 5, the read circuit 112 includes a sense amplifier unit 120 for each global bit line GBL.

The sense amplifier unit 120 includes a preamplifier 121 and a sense amplifier 122.

The preamplifier 121 supplies a current or a voltage to the memory cell MC via the global bit line GBL to generate a voltage (signal voltage, voltage information, or signal) V1st and a voltage (signal voltage, voltage information, or signal) V2nd. Details of the voltage V1st and the voltage V2nd will be described later.

The sense amplifier 122 includes an amplification unit 1221 and a comparison unit 1222.

The amplification unit 1221 amplifies the voltage difference between the voltage V1st and the voltage V2nd generated by the preamplifier 121. Then, the amplification unit 1221 generates a signal DO and a signal DOB (inverted signal of the signal DO) as an amplification result.

The comparison unit 1222 compares the voltage difference between the signal DO and the signal DOB generated by the amplification unit 1221 and outputs the comparison result to the page buffer 114 as the data stored in the memory cell MC.

<1-1-7> Configuration of Preamplifier

Figure 6:
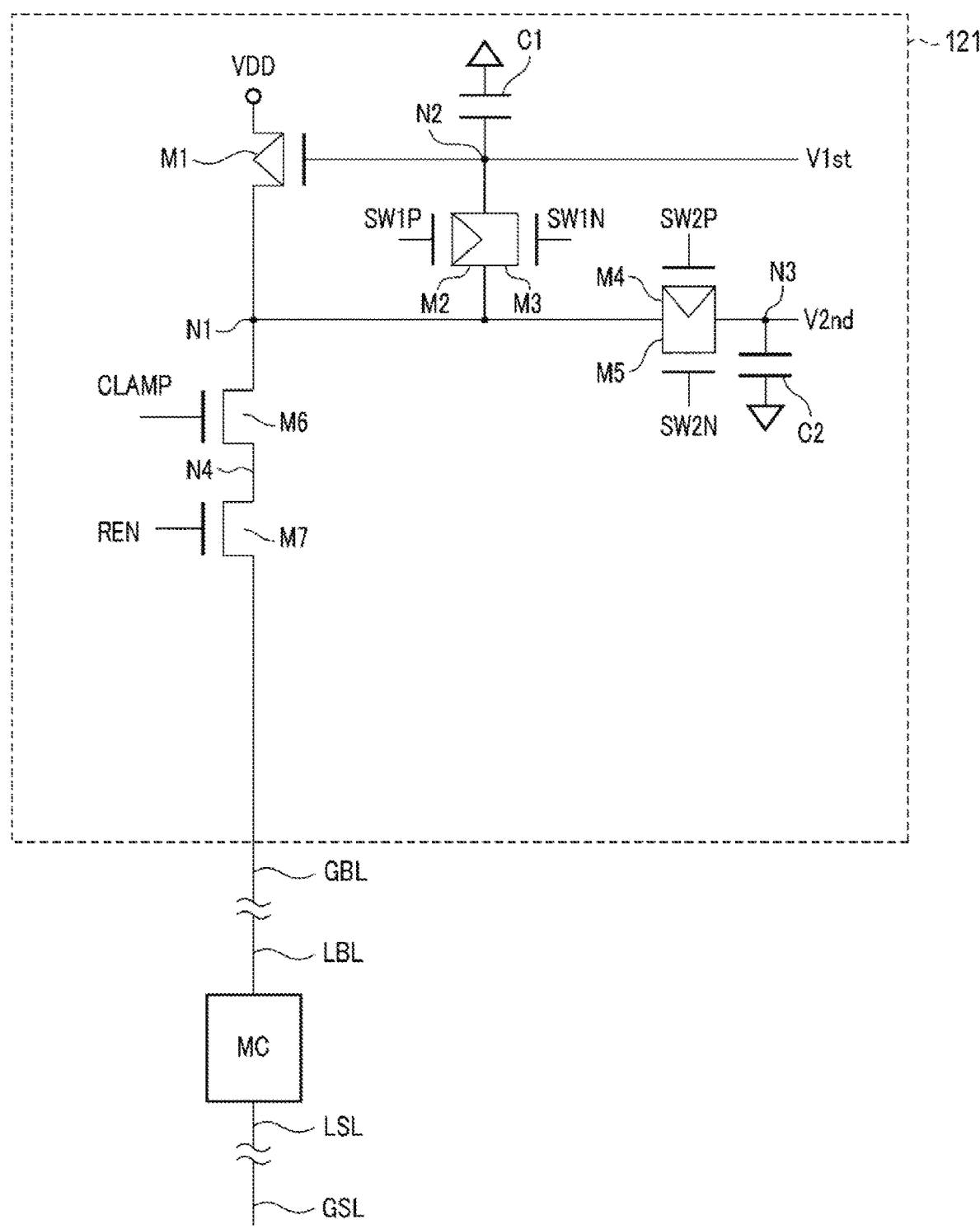
FIG. 6 is a circuit diagram showing a basic configuration of a preamplifier of the semiconductor storage device according to the first embodiment.

Next, the configuration of the preamplifier 121 of the semiconductor storage device 1 according to the first embodiment will be described with reference to FIG. 6. FIG. 6 is a circuit diagram showing the basic configuration of the preamplifier 121 of the semiconductor storage device 1 according to the first embodiment.

As shown in FIG. 6, the preamplifier 121 includes PMOS transistors M1, M2, and M4, NMOS transistors M3, M5, M6, and M7, and capacitors C1 and C2.

A power supply voltage VDD is applied to one end of the transistor M1, the other end is connected to a node N1, and the gate electrode is connected to a node N2.

One end of the transistor M2 is connected to the node N1, the other end is connected to the node N2, and the gate electrode is supplied with a signal SW1P.

One end of the transistor M3 is connected to the node N1, the other end is connected to the node N2, and the gate electrode is supplied with a signal SW1N.

The transistor M2 and the transistor M3 function as one switch.

One end of the transistor M4 is connected to the node N1, the other end is connected to a node N3, and the gate electrode is supplied with a signal SW2P.

One end of the transistor M5 is connected to the node N1, the other end is connected to the node N3, and the gate electrode is supplied with a signal SW2N.

The transistor M4 and the transistor M5 function as one switch.

One end of the transistor M6 is connected to the node N1, the other end is connected to a node N4, and the gate electrode is supplied with a signal CLAMP.

One end of the transistor M7 is connected to the node N4, the other end is connected to a bit line (in particular, global bit line), and the gate electrode is supplied with a signal REN.

One end of the capacitor C1 is connected to the node N2, and a ground voltage Vss is applied to the other end.

One end of the capacitor C2 is connected to the node N3, and the ground voltage Vss is applied to the other end.

The voltage of the node N2 is supplied to the amplification unit 1221 as the voltage V1st.

The voltage of the node N3 is supplied to the amplification unit 1221 as the voltage V2nd.

The operation of the preamplifier 121 will be described later.

<1-1-8> Configuration of Amplification Unit

Figure 7:
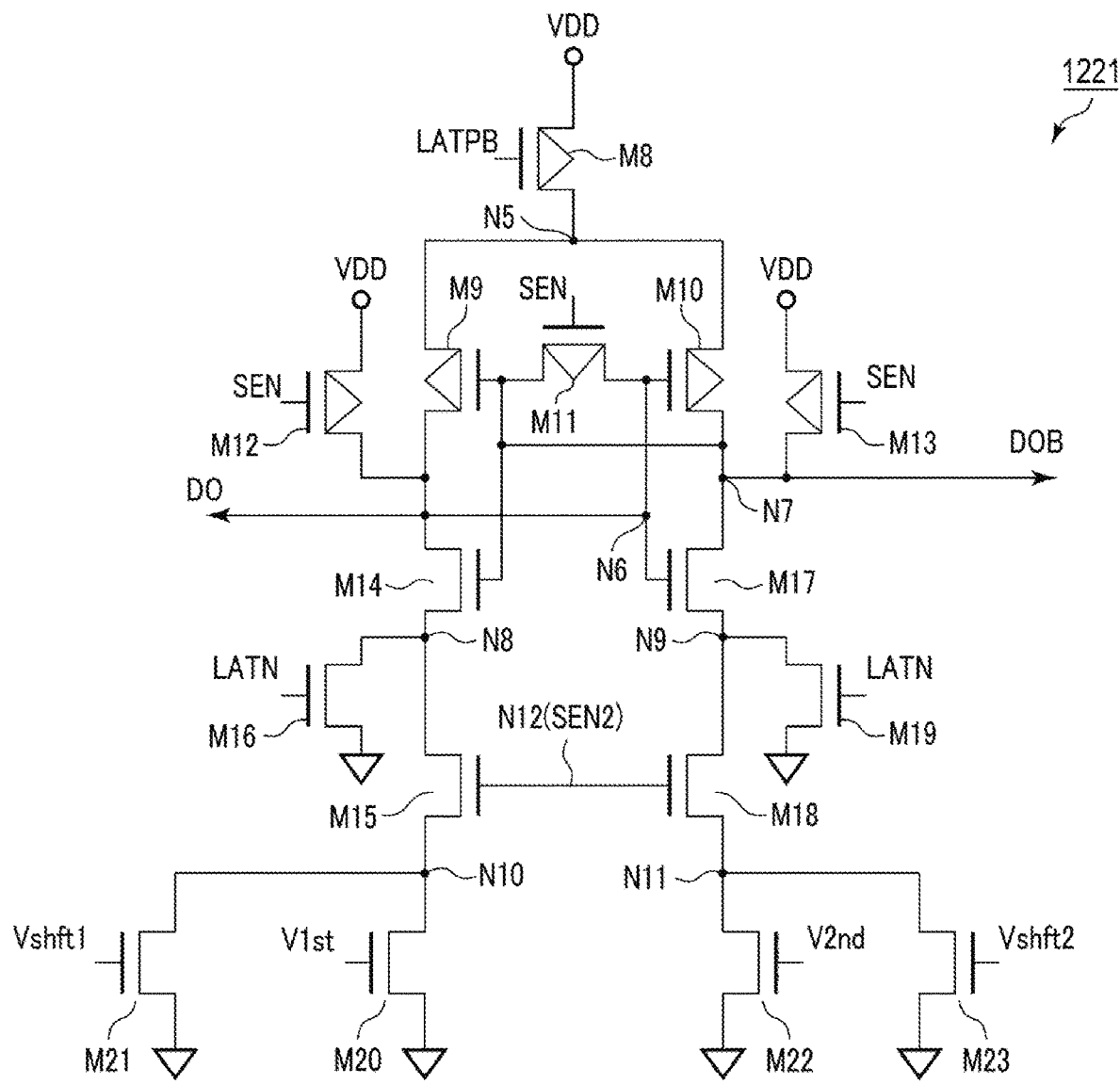
FIG. 7 is a circuit diagram showing a basic configuration of an amplification unit of the semiconductor storage device according to the first embodiment.

Next, the configuration of the amplification unit 1221 of the memory device of the semiconductor storage device 1 according to the first embodiment will be described with reference to FIG. 7. FIG. 7 is a circuit diagram showing the basic configuration of the amplification unit 1221 of the semiconductor storage device 1 according to the first embodiment.

As shown in FIG. 7, the amplification unit 1221 includes PMOS transistors M8, M9, M10, M11, M12, and M13, NMOS transistors M14, M15, M16, M17, M18, M19, M20, M21, M22, and M23.

The power supply voltage VDD is applied to one end of the transistor M8, the other end is connected to a node N5, and the gate electrode is supplied with a signal LATPB.

One end of the transistor M9 is connected to the node N5, the other end is connected to a node N6, and the gate electrode is connected to a node N7.

One end of the transistor M10 is connected to the node N5, the other end is connected to the node N7, and the gate electrode is connected to the node N6.

One end of the transistor M11 is connected to the node N6, the other end is connected to the node N7, and the gate electrode is supplied with a signal SEN.

The power supply voltage VDD is applied to one end of the transistor M12, the other end is connected to the node N6, and the gate electrode is supplied with the signal SEN.

The power supply voltage VDD is applied to one end of the transistor M13, the other end is connected to the node N6, and the gate electrode is supplied with the signal SEN.

One end of the transistor M14 is connected to the node N6, the other end is connected to a node N8, and the gate electrode is connected to the node N7.

One end of the transistor M15 is connected to the node N8, the other end is connected to the node N10, and the gate electrode is supplied with a signal SEN2 via a node N12.

One end of the transistor M16 is connected to the node N8, the ground voltage Vss is applied to the other end, and the gate electrode is supplied with a signal LAIN.

One end of the transistor M17 is connected to the node N7, the other end is connected to the node N9, and the gate electrode is connected to the node N6.

One end of the transistor M18 is connected to the node N9, the other end is connected to the node N11, and the gate electrode is supplied with the signal SEN2 via the node N12.

One end of the transistor M19 is connected to the node N9, the ground voltage Vss is applied to the other end, and the gate electrode is supplied with the signal LAIN.

One end of the transistor M20 is connected to the node N10, the ground voltage Vss is applied to the other end, and the gate electrode is supplied with the voltage V1st.

One end of the transistor M21 is connected to the node N10, the ground voltage Vss is applied to the other end, and the gate electrode is supplied with a signal Vshft1.

One end of the transistor M22 is connected to the node N11, the ground voltage Vss is applied to the other end, and the gate electrode is supplied with the voltage V2nd.

One end of the transistor M23 is connected to the node N11, the ground voltage Vss is applied to the other end, and the gate electrode is supplied with a signal Vshft2.

The voltage of the node N6 is supplied to the comparison unit 1222 as the signal DO.

The voltage of the node N7 is supplied to the comparison unit 1222 as the signal DOB (inverted signal of the signal DO).

The operation of the amplification unit 1221 will be described later.

<1-1-9> MAT

Figure 8:
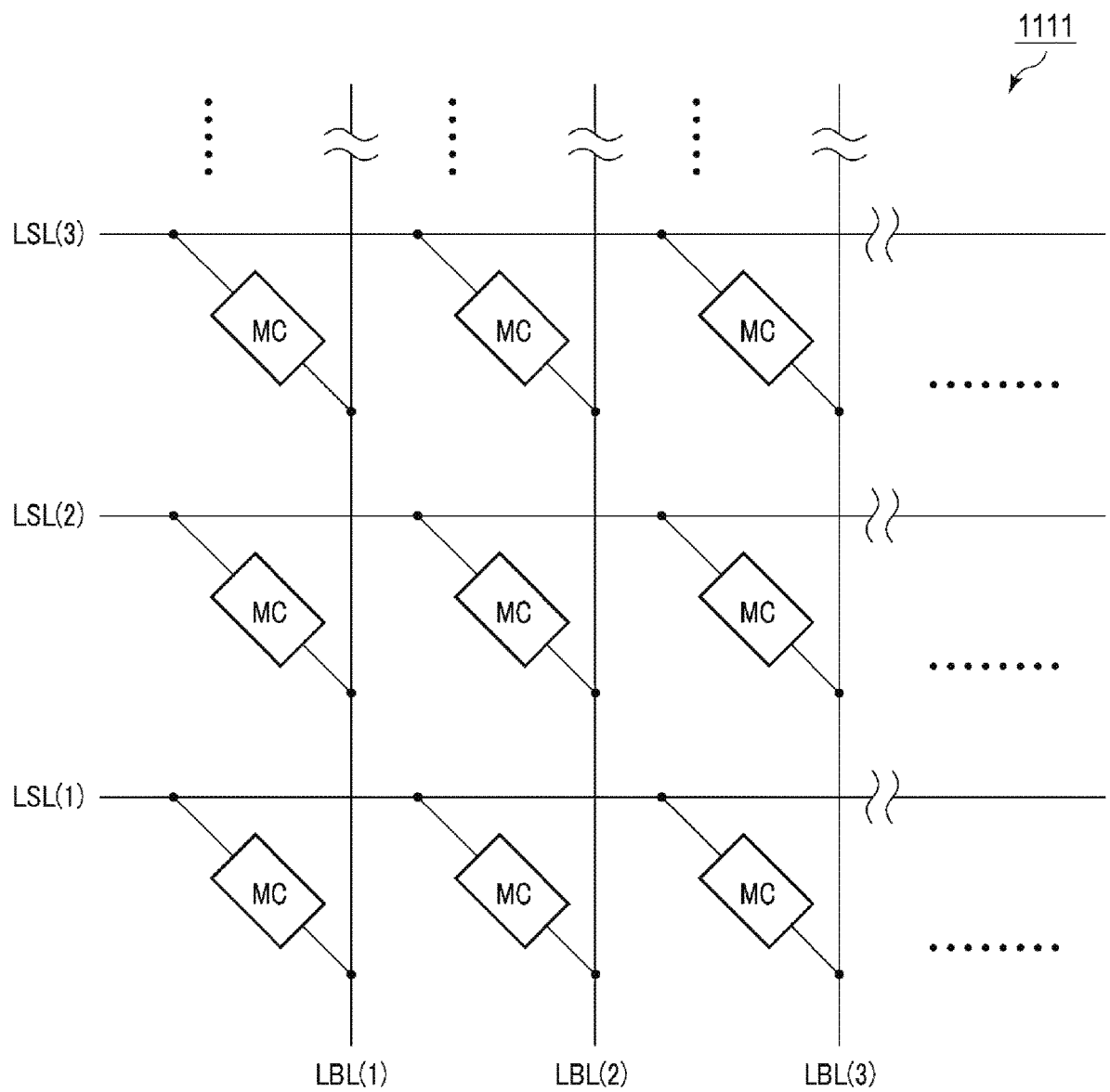
FIG. 8 is a circuit diagram showing a basic arrangement of the memory cells of the semiconductor storage device according to the first embodiment.

Next, the MAT 1111 of the semiconductor storage device 1 according to the first embodiment will be described with reference to FIG. 8. FIG. 8 is a circuit diagram showing the MAT 1111 of the semiconductor storage device 1 according to the first embodiment.

As shown in FIG. 8, the MAT 1111 includes a plurality of memory cells MC arranged in a matrix configuration on a semiconductor substrate. The number of memory cells MC is not limited to any particular number. The memory cells MC arranged in the same column are commonly connected to one of the local bit lines LBL (k: k is an integer of 0 or more). Further, the memory cells MC arranged in the same row are commonly connected to one of the local source lines LSL (m: m is an integer of 0 or more). The memory cell MC includes an MTJ element and a selector.

<1-1-10> Memory Cell MC

<1-1-10-1> Outline

<1-1-10-1-1> First Example

Figure 9:
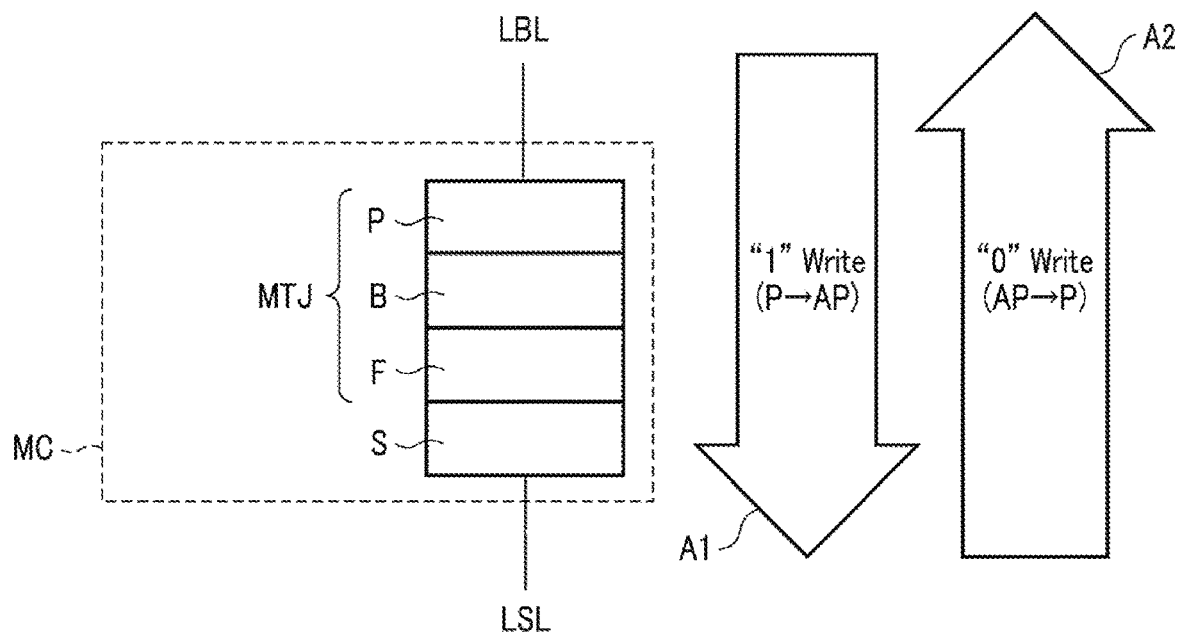
FIG. 9 is a block diagram showing a first example of a configuration of a memory cell of the semiconductor storage device according to the first embodiment.

Next, a first example of the configuration of the memory cell MC of the semiconductor storage device 1 according to the first embodiment will be schematically described with reference to FIG. 9. FIG. 9 is a block diagram showing the first example of the configuration of the memory cell MC of the semiconductor storage device 1 according to the first embodiment. As shown in FIG. 9, one end of the MTJ element of the memory cell MC according to the first embodiment is connected to the local bit line LBL, and the other end is connected to one end of the selector S. The other end of the selector S is connected to the local source line LSL. The MTJ element utilizing the tunneling magnetoresistive (TMR) effect has a stacked structure composed of two ferromagnetic layers F and P and a nonmagnetic layer (tunnel insulating film) B sandwiched therebetween and stores digital data by changing the magnetic resistance due to the spin polarization tunnel effect. The MTJ element can have a low-resistance state and a high-resistance state depending on the magnetization arrangement of the two ferromagnetic layers F and P. For example, if the low-resistance state is defined as "0" data and the high-resistance state is defined as "1" data, 1-bit data can be stored in the MTJ element. Alternatively, the low-resistance state may be defined as "1" data and the high-resistance state may be defined as "0" data.

For example, the MTJ element is configured by sequentially stacking a storage layer (also referred to as a free layer) F, a nonmagnetic layer B, and a reference layer (also referred to as a pinned layer or a fixed layer) P. The reference layer P and the storage layer F are made of a ferromagnetic material, and the nonmagnetic layer B is made of an insulating film (for example, $Al_2O_3$ and MgO). The reference layer P is a layer whose magnetization direction is fixed, and the storage layer F has a variable magnetization direction and stores data according to the direction of the magnetization.

When a current is passed in the direction of an arrow A1 during writing, the magnetization direction of the free layer F becomes antiparallel to the magnetization direction of the pinned layer P (AP state), and a high-resistance state ("1" data) is obtained. When a current is passed in the direction of an arrow A2 during writing, the magnetization directions of the pinned layer P and the free layer F are in a parallel state (P state), and a low-resistance state ("0" data) is obtained. In this way, the MTJ element can write different data depending on the direction of current flow. The above-described "variable magnetization direction" means that the magnetization direction changes with a predetermined write current. Further, "fixed magnetization direction" means that the magnetization direction does not change with the predetermined write current.

The selector S in the present embodiment is, for example, a two-terminal type switching element. When the voltage applied between the two terminals is equal to or lower than a threshold voltage, the switching element is in an "OFF" state, for example, an electrically high-resistance state. When the voltage applied between the two terminals is equal to or higher than the threshold voltage, the switching element changes to an "ON" state, for example, an electrically low-resistance state. The switching element may have this function regardless of the polarity of the voltage. For example, the switching element may include, for example, at least one or more chalcogen element selected from the group consisting of Te, Se, and S. Alternatively, the switching element may include, for example, chalcogenide which is a compound containing the above chalcogen element. Further alternatively, this switching element may include, for example, doped $SiO_2$ or the like other than chalcogenide.

<1-1-10-1-2> Second Example

Figure 10:
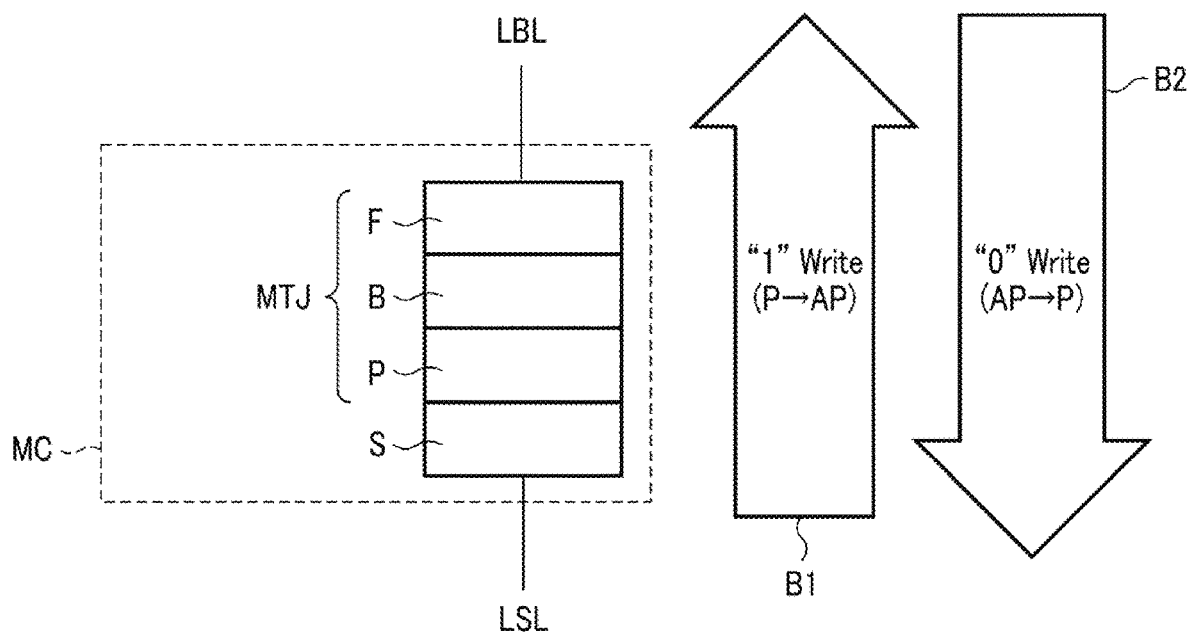
FIG. 10 is a block diagram showing a second example of the configuration of the memory cell of the semiconductor storage device according to the first embodiment.

Next, a second example of the configuration of the memory cell MC of the semiconductor storage device 1 according to the first embodiment will be schematically described with reference to FIG. 10. FIG. 10 is a block diagram showing the second example of the configuration of the memory cell MC of the semiconductor storage device 1 according to the first embodiment. Hereinafter, only the points different from the first example will be described. As shown in FIG. 10, in the second example, the MTJ element is configured by sequentially stacking a reference layer (pinned layer, fixed layer) P, a nonmagnetic layer B, and a storage layer (free layer, storage layer) F.

When a current is passed in the direction of an arrow B1 during writing, the magnetization direction of the free layer F becomes antiparallel to the magnetization direction of the pinned layer P (AP state), and a high-resistance state ("1" data) is obtained. When a current is passed in the direction of an arrow B2 during writing, the magnetization directions of the pinned layer P and the free layer F are in a parallel state (P state), and a low-resistance state ("0" data) is obtained.

The configuration of the memory cell MC will be described below for the semiconductor storage device 1 based on the first example.

<1-1-10-2> Selector Characteristics

Figure 11:
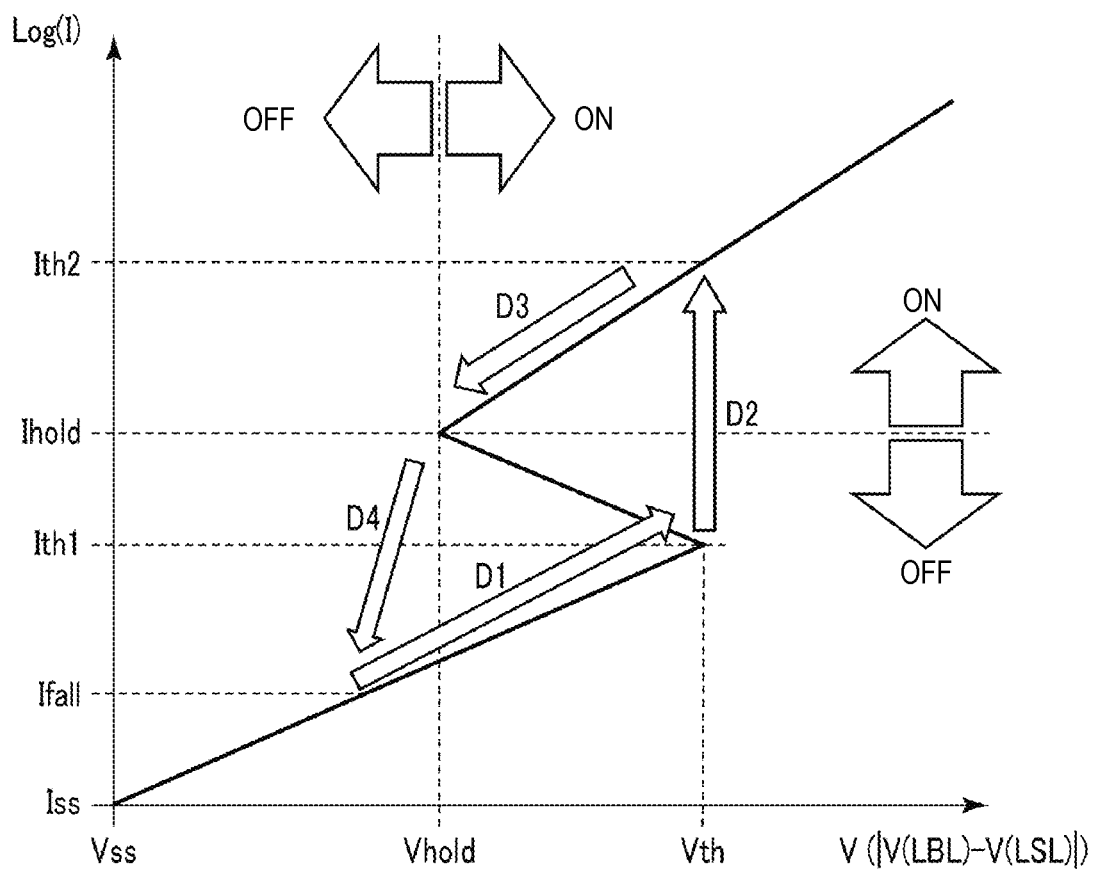
FIG. 11 is a diagram showing a current-voltage characteristic of a selector of the memory cell of the semiconductor storage device according to the first embodiment.

Next, the current-voltage (IV) characteristic of the selector S of the semiconductor storage device 1 according to the first embodiment will be described with reference to FIG. 11. FIG. 11 is a graph showing the current-voltage (IV) characteristic of the selector S. The horizontal axis of FIG. 11 represents the voltage applied to the selector S (the absolute value of the difference between the local bit line voltage V (LBL) and the local source line voltage V (LSL)), and the vertical axis in FIG. 11 represents the current flowing through the selector S (selector current). The vertical axis of FIG. 11 is a Log scale.

First, the characteristic of the selector S when a voltage is applied to the selector S will be described. The selector S has a characteristic called snapback. Here, in the selector S, a state in which the selector current is equal to or higher than a current Iss and lower than the current Ihold is defined as "selector S in an OFF state". In other words, when the selector S is in the OFF state, the selector current is equal to or higher than the current Iss and is lower than the current Ihold. Further, in the selector S, a state in which the selector current is equal to or higher than the current Ihold is defined as "selector S in an ON state". In other words, when the selector S is in the on state, the selector current is equal to or higher than the current Ihold.

When a voltage whose absolute value is equal to or higher than a voltage Vth is applied to the selector S, the selector S enters the ON state. Then, by applying a voltage whose absolute value is lower than the voltage Vhold to the selector S, the selector S enters the OFF state.

The current-voltage (IV) characteristic of the selector S will be specifically described below.

As shown in FIG. 11, in the selector S in the OFF-state, the selector current increases linearly until the absolute value of the voltage applied to the selector S exceeds the voltage Vth (see arrow D1). When the absolute value of the voltage applied to the selector S exceeds the voltage Vth, the selector current rapidly increases from a current Ith1 to a current Ith2 (>Ihold>Ith1) (see arrow D2). As shown by arrows D1 and D2 in FIG. 11, the selector current increases nonlinearly from the current Iss to the current Ith2. As described above, when the selector current is equal to or higher than the current Ihold, the selector S is defined to be in an ON state. Then, in the selector S in the ON state, until the absolute value of the voltage applied to the selector S becomes lower than the voltage Vhold, when the selector current decreases linearly (see arrow D3) and becomes lower than the voltage Vhold, the selector current rapidly decreases from the current Ihold to a current Ifall (<<Ihold) (see arrow D4). As indicated by arrows D3 and D4 in FIG. 11, the selector current decreases nonlinearly from the current Ith2 to the current Ifall. As described above, a state where the selector current is lower than the current Ihold is defined as the selector S in an OFF state.

That is, when the absolute value of the voltage applied to the selector S exceeds the voltage Vth, the selector S enters the ON state. Then, when the absolute value of the voltage applied to the selector S becomes lower than the voltage Vhold after the selector S enters the ON state, the selector S transitions to the OFF state.

Next, the current-voltage (IV) characteristic when the MTJ element and the selector S of the semiconductor storage device 1 according to the first embodiment are combined will be schematically described.

The current-voltage characteristic when the MTJ element and the selector S are combined is slightly different depending on the resistance state of the MTJ element. However, the rough current-voltage characteristic when the MTJ element and the selector S are combined is similar to the current-voltage characteristic of the selector S described above. Therefore, in the present specification, the current-voltage characteristic of the selector S described above is treated as the current-voltage characteristic of the memory cell MC.

Figure 12:
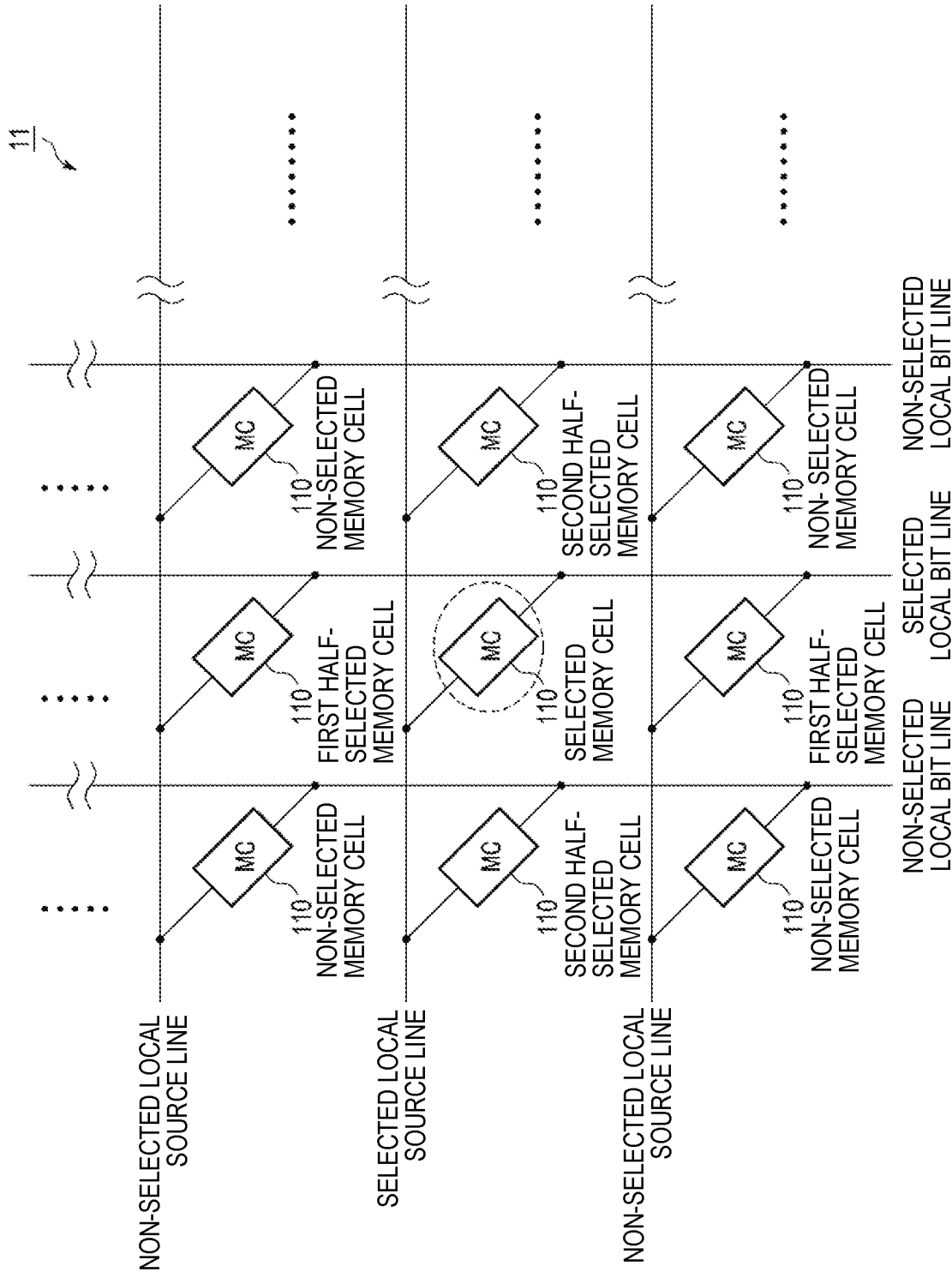
FIG. 12 is a circuit diagram showing a selected memory cell, a non-selected memory cell, and a half-selected memory cell.

<1-1-11> Definitions of Selected Memory Cell MC, Non-Selected Selected Memory Cell MC, and Half-Selected Memory Cell MC Here, the definitions of a selected memory cell MC, a non-selected memory cell MC, and a half-selected memory cell MC will be described with reference to FIG. 12. FIG. 12 is a circuit diagram showing the selected memory cell MC, the non-selected memory cell MC, and the half-selected memory cell MC.

As shown in FIG. 12, the selected memory cell MC is the memory cell MC to be read. The local bit line LBL connected to the selected memory cell MC is referred to as a selected local bit line LBL. In addition, the local source line LSL connected to the selected memory cell MC is referred to as a selected local source line LSL.

As shown in FIG. 12, the non-selected memory cell MC is a memory cell MC that is not connected to either the selected local bit line LBL or the selected local source line LSL. The local bit line LBL connected to the non-selected memory cell MC is referred to as a non-selected local bit line LBL. Further, the local source line LSL connected to the non-selected memory cell MC is referred to as a non-selected local source line LSL.

As shown in FIG. 12, the half-selected memory cell MC is not the memory cell MC to be read but is a memory cell MC connected to either the selected local bit line LBL or the selected local source line LSL. Here, the memory cell MC connected to the selected local bit line LBL and the non-selected local source line LSL is referred to as a first half-selected memory cell MC. The memory cell MC connected to the non-selected local bit line LBL and the selected local source line LSL will be referred to as a second half-selected memory cell MC.

<1-2> Operation

As described above, the MTJ element in the memory cell MC stores data by using a change in a resistance value. When reading the data stored in such a memory cell MC, the semiconductor storage device 1 supplies a read current (also referred to as a cell current) to the memory cell MC. Then, the semiconductor storage device 1 converts the resistance state of the MTJ element in the memory cell MC into a current value or a voltage value. Then, the semiconductor storage device 1 can determine the resistance state of the MTJ element in the memory cell MC by comparing the current value or the voltage value with a reference value.

However, as the resistance variation of the MTJ element increases, the interval between the resistance value distribution of "0" data and the resistance value distribution of "1" data may become narrow. Therefore, in a read method for setting a reference value between the resistance value distribution of "0" data and the resistance value distribution of "1" data and determining the state of the MTJ element based on the magnitude of the reference value, the read margin is significantly reduced.

Therefore, in the first embodiment, shift signal information is added to signal information (which in the form of a current value or a voltage value) of one of the "0" data and "1" data of the MTJ element to obtain the reference signal. Then, a self-reference reading method for determining the initial state of the MTJ element based on the reference signal will be described.

The read operation of the semiconductor storage device 1 according to the first embodiment will be described below.

<1-2-0> Principle of Read Operation

When the self-reference read method is performed, the operation of measuring the resistance state of the memory cell MC is performed twice by supplying a current to the memory cell MC. In this case, the current source that supplies the current to the memory cell MC changes the amount of the supplied current according to the resistance state of the memory cell MC. Then, the current source supplies a current to the memory cell MC such that the memory cell MC in one resistance state maintains the ON state and the memory cell MC in the other resistance state repeats the transition between the OFF state and the ON state, during a second read operation. The principle will be described below.

Figure 13:
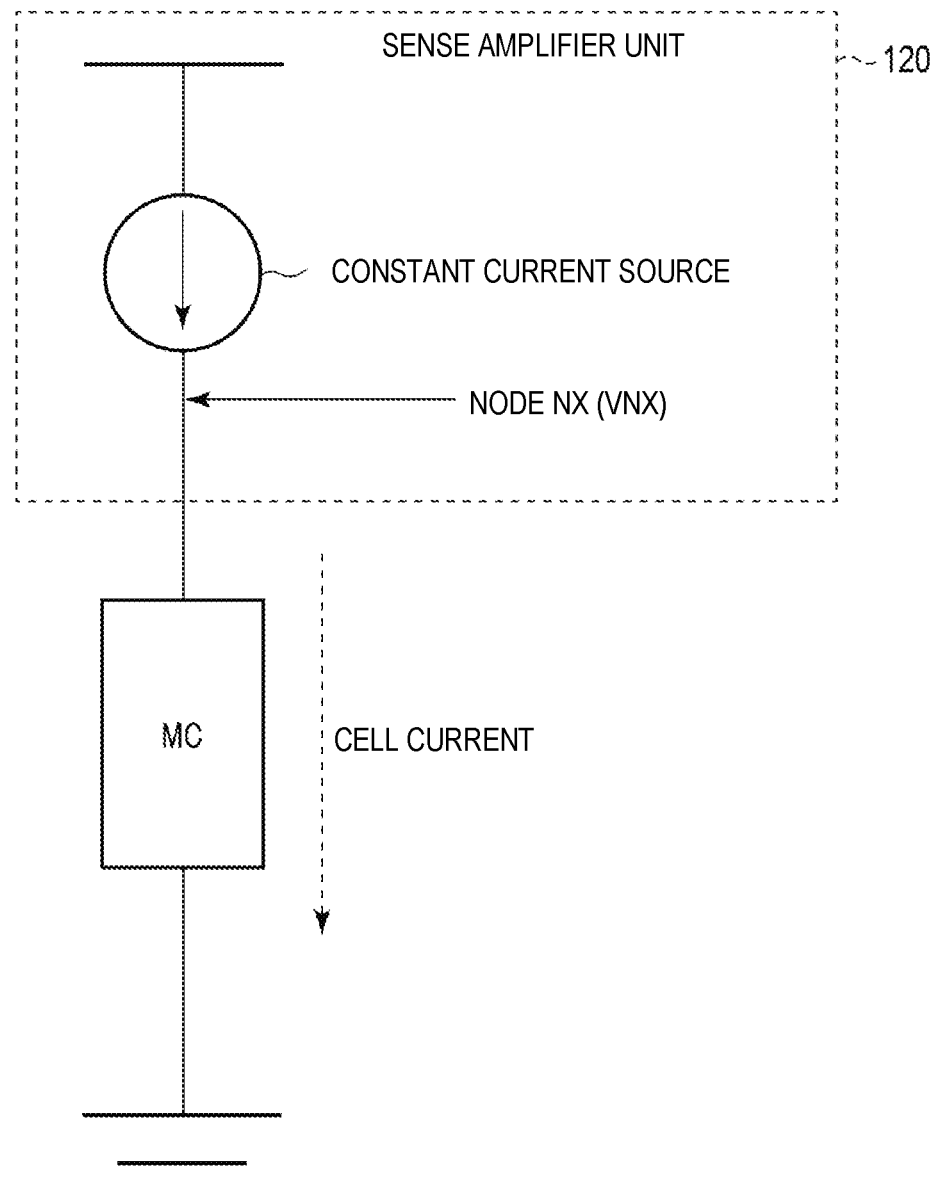
FIG. 13 is a diagram showing a relationship between a memory cell of the semiconductor storage device according to the first embodiment and a current source.
Figures 14, 15:
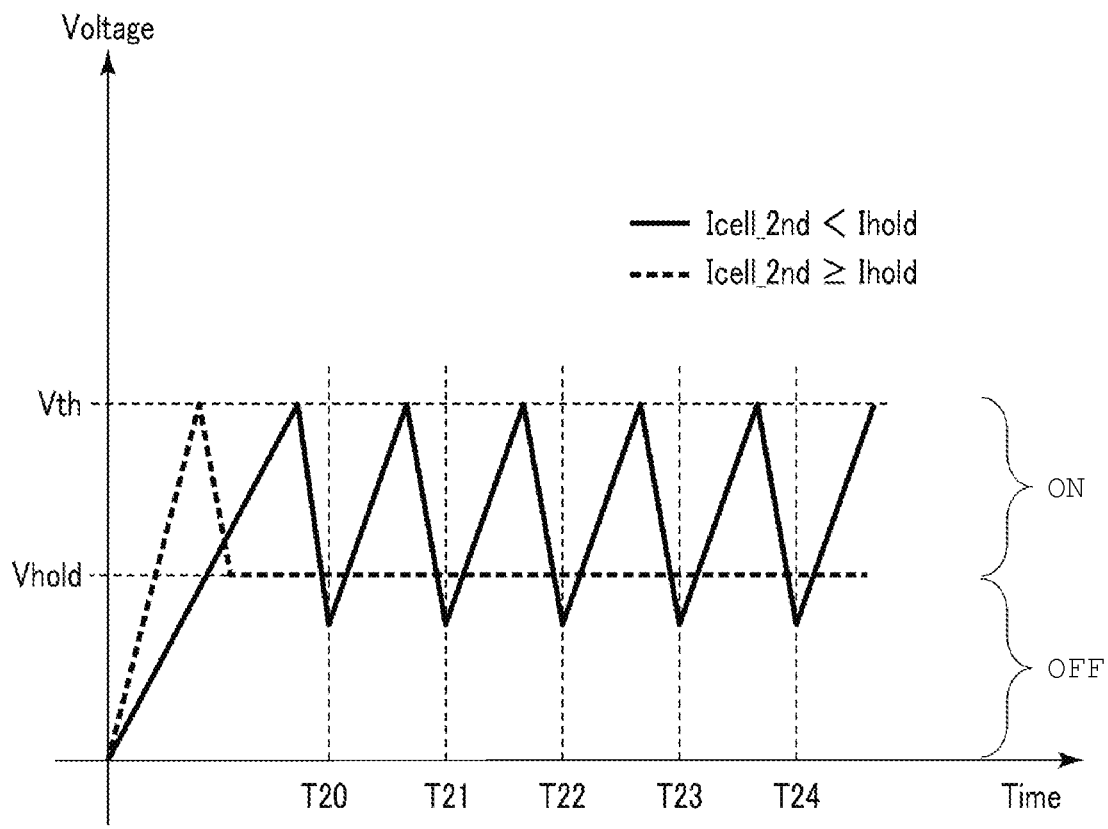
FIG. 14 is a diagram showing a relationship between changes in a resistance state of the memory cell, and a voltage level at a node between the memory cell and the current source relative to a predetermined voltage.
FIG. 15 is a diagram showing voltages applied to the memory cell over time when a cell current is lower than a predetermined current and when the cell current is higher than the predetermined current.

The principle of the read operation of the semiconductor storage device 1 according to the first embodiment will be described with reference to FIGS. 11 and 13 to 15. FIG. 13 is a diagram showing a relationship between the memory cell MC of the semiconductor storage device 1 according to the first embodiment and a current source. FIG. 14 is a diagram showing a relationship between a change in the resistance state of the memory cell MC and a voltage VNX of the node NX relative to the voltage Vhold. FIG. 15 is a diagram showing voltages applied to the memory cell MC over time when the cell current Icell_2nd is lower than the current Ihold and when the cell current Icell_2nd is higher than the current Ihold.

In order to describe the read operation of the semiconductor storage device 1 according to the first embodiment, a rough relationship between the memory cell MC and the sense amplifier unit 120 will be described. As shown in FIG. 13, the sense amplifier unit 120 includes a constant current source and supplies a constant current to the memory cell MC. The sense amplifier unit 120 measures a voltage at the node NX between the constant current source and the memory cell MC. The sense amplifier unit 120 can measure the resistance state of the memory cell MC by measuring the voltage at the node NX. The constant current source supplies a current twice to the memory cell MC, for example. More specifically, the constant current source supplies the current of a first intensity to the memory cell MC at a first time. Thereafter, the constant current source supplies the current of a second intensity to the memory cell MC at a second time according to the voltage VNX of the node NX measured at the first time. The second intensity is set based on the voltage VNX of the node NX measured at the first time, that is, based on whether the memory cell MC was in the low-resistance state or in the high-resistance state at the first time.

Here, the types of changes in the resistance state of the memory cell MC will be described.

As shown in FIG. 14, the changes of the resistance state of the memory cell MC is roughly divided into four cases.

[Case 1]

In Case 1, the memory cell MC is in the low-resistance state in a first read operation and is also in the low-resistance state in a second read operation. In this case, the voltage VNX of the node NX during the second read operation becomes equal to the voltage Vhold.

[Case 2]

In Case 2, the memory cell MC is in the low-resistance state in the first read operation and changes to the high-resistance state in the second read operation. In this case, the voltage VNX of the node NX during the second read operation becomes higher than the voltage Vhold.

[Case 3]

In Case 3, the memory cell MC is in the high-resistance state in the first read operation and changes to the low-resistance state in the second read operation. In this case, the voltage VNX of the node NX during the second read operation becomes lower than the voltage Vhold.

[Case 4]

In Case 4, the memory cell MC is in high-resistance state in the first read operation and is also in the high-resistance state in the second read operation. In this case, the voltage VNX of the node NX during the second read operation becomes equal to the voltage Vhold.

Here, the description is of Case 1. The voltage VNX of the node NX can be regarded as a voltage applied to the memory cell MC. When the voltage VNX of the node NX is equal to the voltage Vhold as in Case 1, the cell current Icell_2nd flowing through the memory cell MC is equal to or higher than the current Ihold (current corresponding to the voltage Vhold). Since the constant current source is connected to the memory cell MC, the voltage applied to the memory cell MC is boosted along the arrow D1 as shown in FIG. 11. Then, when the voltage applied to the memory cell MC exceeds Vth, the characteristic changes along the arrows D2 and D3. Then, in Case 1, since the voltage VNX, which is approximately the same as the voltage Vhold, is applied to the memory cell MC, the memory cell MC stabilizes at Vhold. That is, the memory cell MC transitions from the OFF state to the ON state, and then maintains the ON state.

Next, the description is focused on Case 3. When the voltage VNX of the node NX becomes lower than the voltage Vhold as in Case 3, the cell current Icell_2nd flowing through the memory cell MC becomes lower than the current Ihold (current corresponding to the voltage Vhold). Since the constant current source is connected to the memory cell MC, the voltage applied to the memory cell MC is boosted along the arrow D1 as shown in FIG. 11. When the voltage applied to the memory cell MC exceeds Vth, the characteristic changes along the arrows D2 and D3. Then, in Case 3, since the voltage VNX lower than the voltage Vhold is applied to the memory cell MC, the characteristic changes along the arrow D4. That is, the memory cell MC transitions from the OFF state to the ON state, and then transitions from the ON state to the OFF state. Then, as described above, the memory cell MC transitions from the OFF state to the ON state again. Thus, in Case 3, the memory cell MC repeats the transition between the OFF state and the ON state.

As shown in FIG. 15, in Case 1 (Icell_2nd≥Ihold), the voltage applied to the memory cell MC stabilizes at the voltage Vhold after reaching the voltage Vth. That is, the memory cell MC transitions from the OFF state to the ON state, and then stabilizes in the ON state. In Case 1 (Icell_2nd Ihold), the voltage applied to the memory cell MC stabilizes at the voltage Vhold after reaching the voltage Vth. That is, the memory cell MC transitions from the OFF state to the ON state, and then stabilizes in the ON state.

As shown in FIG. 15, in Case 3 (Icell_2nd<Ihold), the voltage applied to the memory cell MC reaches the voltage Vth, and then falls below the voltage Vhold. Then, the voltage is boosted again and reaches the voltage Vth, and then falls below the voltage Vhold again. That is, the memory cell MC repeats the transition from the OFF state to the ON state.

In the present embodiment, a read operation is performed by using the principle of repeating the transition from the OFF state to the ON state of the memory cell MC in Case 3. As will be described later, in Case 3, it is possible to secure the read margin by performing the read operation at the timing when the voltage applied to the memory cell MC is low (times T20, T21, T22, T23, and T24).

<1-2-1> Flowchart of Read Operation

Figure 16:
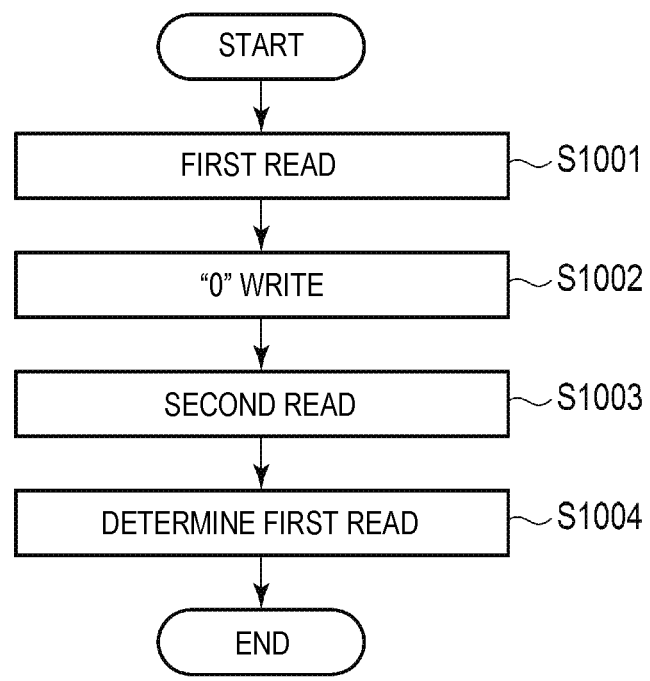
FIG. 16 is a flow chart showing a read operation of the semiconductor storage device according to the first embodiment.

A flowchart of the read operation of the semiconductor storage device 1 according to the first embodiment will be described with reference to FIG. 16. FIG. 16 is a flowchart of the read operation of the semiconductor storage device 1 according to the first embodiment.

[Step S1001]

When the memory controller 2 receives a read command (which is one type of host command) from the host 3, the memory controller 2 issues an active command and a read command to the semiconductor storage device 1.

When the semiconductor storage device 1 receives the active command and the read command from the memory controller 2, the semiconductor storage device 1 performs a first read operation (1st READ) on the selected memory cell MC to be read.

The first read operation will be described below. During the first read operation, the semiconductor storage device 1 performs an operation for switching the selector S of the selected memory cell MC to the ON state. As a result, the current flowing through the selected memory cell MC (referred to as cell current) is equal to or higher than the current Ihold. Hereinafter, "switching the selector of the selected memory cell MC to an ON state" will be referred to as "switching the selected memory cell MC to an ON state" for convenience. By the first read operation, the preamplifier 121 stores the resistance state of the memory cell MC to be read as the voltage V1st.

[Step S1002]

Next, the semiconductor storage device 1 sets the memory cell MC to a reference state (here, "0" data) in order to generate the voltage V2nd described later. Specifically, the semiconductor storage device 1 performs a first write (for example, "0" write operation (WRITE "0")) of writing first data (for example, "0" data) to the selected memory cell MC which is the target of the first read operation. As a result, the data stored in the selected memory cell MC which is the target of the first read operation is overwritten with the first data.

[Step S1003]

The semiconductor storage device 1 performs a second read operation (2nd READ) on the selected memory cell MC that is the target of the first read operation. The preamplifier 121 generates the voltage V2nd by this second read operation. At this time, the preamplifier 121 switches the "ON state" or the "OFF state" of the selected memory cell MC according to the data stored in the selected memory cell MC in step S1001. Details will be described later, but a brief description will be given here. The preamplifier 121 maintains the ON state of the selected memory cell MC when the selected memory cell MC stores "0" data in step S1001. On the other hand, if the selected memory cell MC stores "1" data in step S1001, the preamplifier 121 switches the selected memory cell MC to the ON state and then to the OFF state. As a result, it is possible to secure a sufficient difference (or margin) between the voltage V2nd (V2nd_0)

when the selected memory cell MC stores "0" data in step S1001 and the voltage V2nd (V2nd_1) when the selected memory cell MC stores "1" data in step S1001.

[Step S1004]

The sense amplifier unit 120 determines the result of the voltage V1st generated in step S1001 based on the voltage V2nd generated in step S1003. Specifically, the sense amplifier unit 120 determines the data stored in the memory cell MC by comparing the current obtained by adding the current I1st based on the voltage V1st and a reference current Ishift1, and the current I2nd based on the voltage V2nd.

<1-2-2> Specific Example of Read Operation

Figure 17:
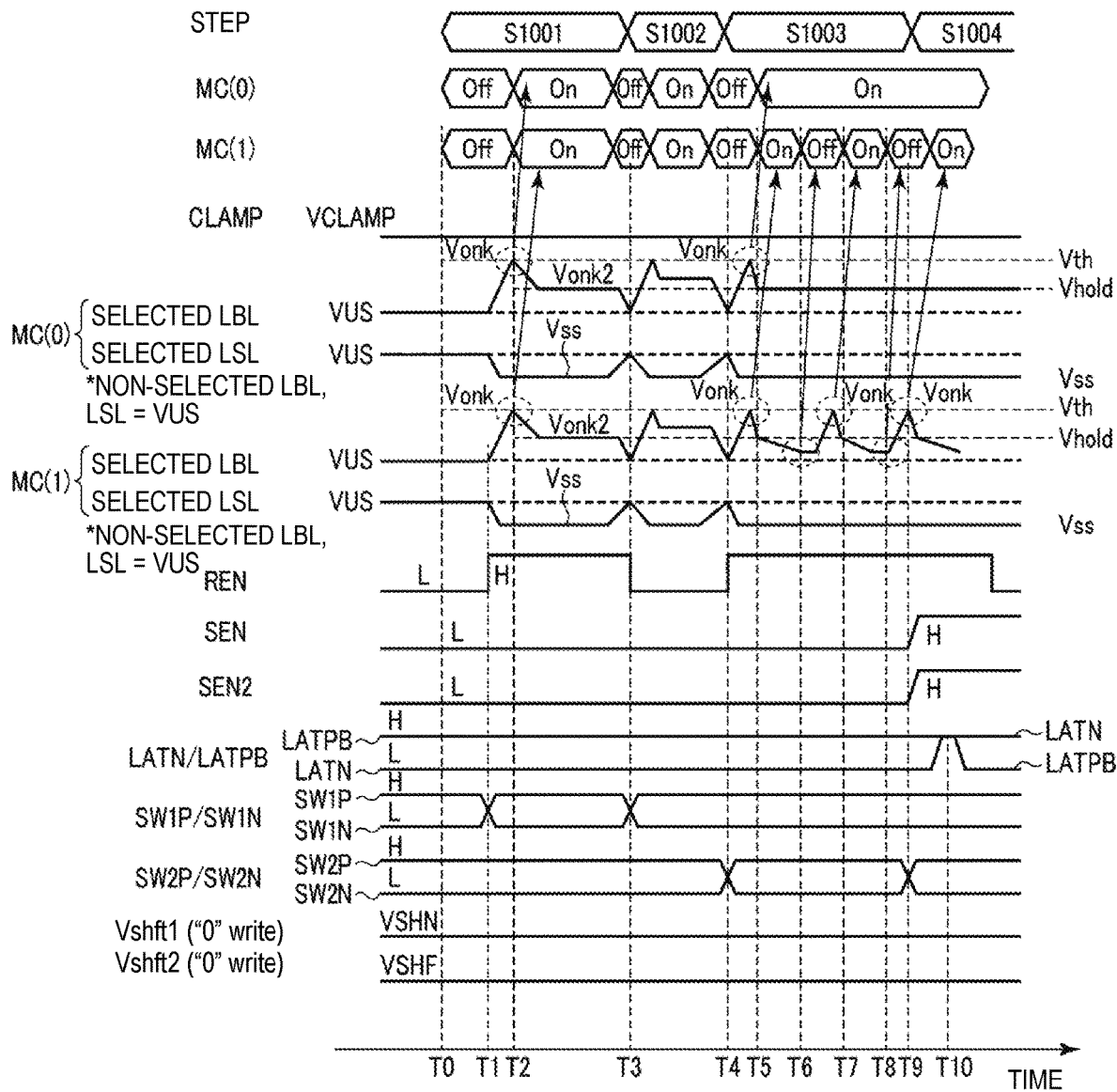
FIG. 17 is a timing chart showing an example of the read operation of the semiconductor storage device according to the first embodiment.

A specific example of a read operation of the semiconductor storage device 1 according to the first embodiment will be described with reference to the waveform chart of FIG. 17. FIG. 17 is a waveform chart showing a specific example of the read operation of the semiconductor storage device 1 according to the first embodiment. FIG. 17 shows a time relationship between the steps shown in FIG. 16, the state of the selected memory cell MC (when "0" data is stored in step S1001 and when "1" data is stored in step S1001), and the voltages of the signal CLAMP, the local bit line LBL, the local source line LSL, the signal REN, the signal SEN, the signal SEN2, the signal LAIN, the signal LATPB, the signal SW1P, the signal SW1N, the signal SW2P, the signal SW2N, the signal Vshft1, and the signal Vshft2. In FIG. 17, the selected memory cell MC when "0" data is stored in step S1001 is expressed as MC(0). Further, the selected memory cell MC when "1" data is stored in step S1001 is expressed as MC(1).

The voltages shown in FIG. 17 is either a voltage transferred from outside the semiconductor storage device 1 or a voltage generated inside the semiconductor storage device 1 (for example, the controller 15). The voltages of the signal CLAMP, the signal REN, the signal SEN, the signal SEN2, the signal LAIN, the signal LATPB, the signal SW1P, the signal SW1N, the signal SW2P, the signal SW2N, the signal Vshft1, and the signal Vshft2 are voltages supplied from the controller 15. The voltage (VLBL) of the local bit line LBL is a voltage supplied from the read circuit 112 or the write circuit 113. The voltage (VLSL) of the local source line LSL is a voltage supplied from the write circuit 113.

[Time T0] to [Time T3]

In the ON operation at time T0 (step S1001), the controller 15 fixes the voltage of the signal CLAMP to an analog voltage having a constant value (for example, voltage VCLAMP). The voltage VCLAMP is, for example, a voltage that switches the transistor M6 to the ON state.

At time T0, the controller 15 sets the voltages of the signal REN, the signal SEN, the signal SEN2, the signal LATN, the signal SW1N, and the signal SW2N to "L (Low)" level and sets the voltages of the signal LATPB, the signal SW1P, and the signal SW2P to "H (High)" (L level<H level). Further, the controller 15 sets the voltages of the local bit line LBL and the local source line LSL to the voltage VUS (Vss<VUS). The controller 15 fixes the voltage of the signal Vshft1 to an analog voltage having a constant value (for example, voltage VSHN). The voltage VSHN is, for example, a voltage that switches the transistor M21 to the ON state. Further, the controller 15 fixes the voltage of the signal Vshft2 to an analog voltage having a constant value (for example, voltage VSHF). The voltage VSHF is, for example, a voltage that switches the transistor M23 to the OFF state.

From time T0 to time T1, since the voltage applied to the selected memory cell MC is 0 V, which is lower than the voltage Vhold required to switch the selected memory cell MC to the ON state, the selected memory cell MC is in the OFF state.

In the ON operation at time T1 (step S1001), the controller 15 sets the signal REN and the signal SW1N to "H" level and the signal SW1P to "L" level. Further, the controller 15 maintains the voltage of the non-selected local source line LSL at the voltage VUS and lowers the voltage of the selected local source line LSL to the voltage Vss.

Figure 18:
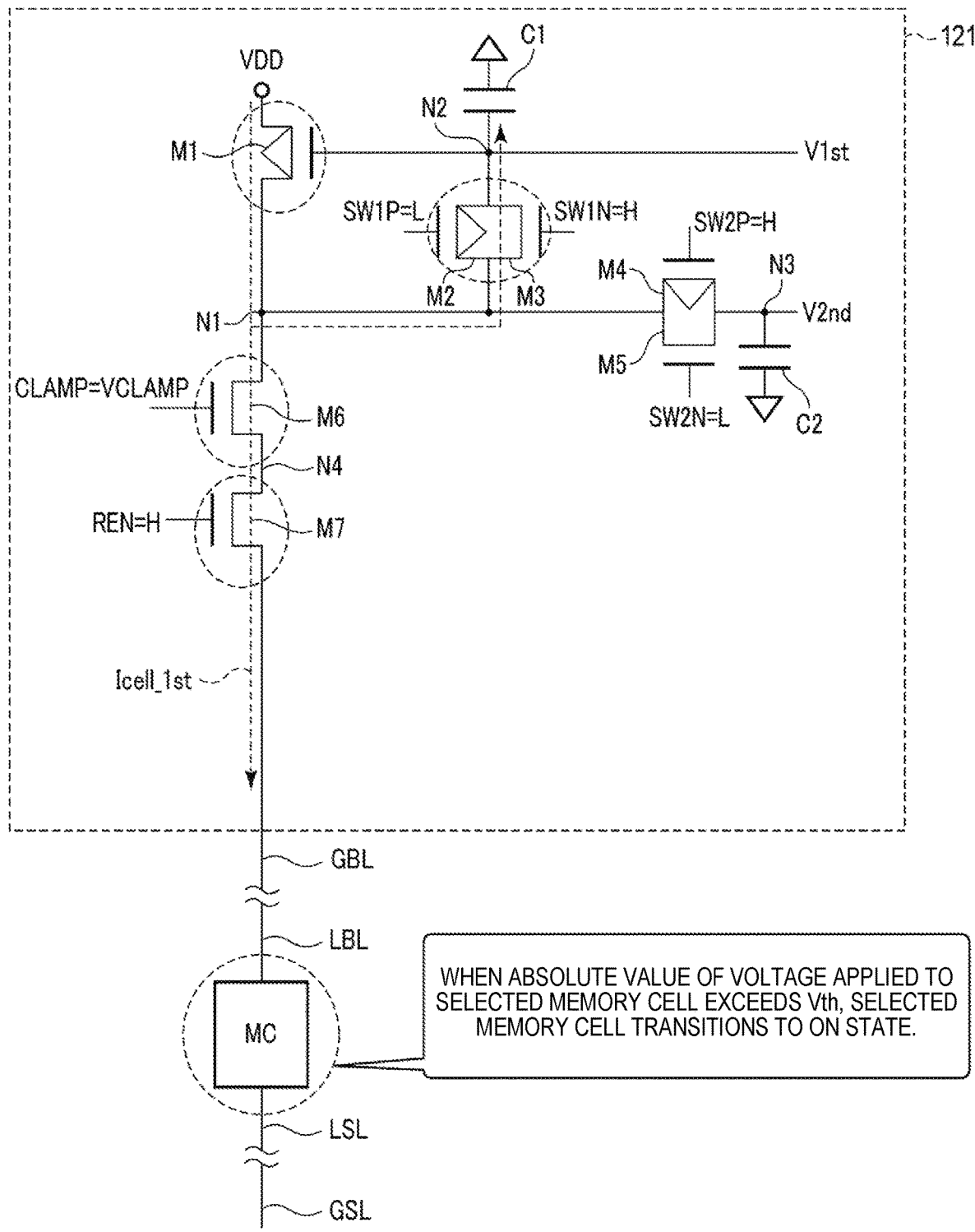
FIG. 18 is a circuit diagram illustrating an operation example of the preamplifier during a first time period depicted in FIG. 17.

Here, the preamplifier 121 from time T1 to time T3 in FIG. 17 will be described with reference to FIG. 18. FIG. 18 is a circuit diagram showing the preamplifier 121 from time T1 to time T3 in FIG. 17.

As shown in FIG. 18, the transistors M2, M3, M6, and M7 are in the ON state. Further, the transistors M4 and M5 are in the OFF state. As a result, the node N1 is grounded (for example, voltage Vss) via the transistor M6, the node N4, the transistor M7, the global bit line GBL, the local bit line LBL, the memory cell MC, the local source line LSL, and the global source line GSL. As a result, the voltage of the node N1 decreases. Further, the voltage of the node N1 is transferred to the node N2 via the transistors M2 and M3. Therefore, the voltage of the node N2 is lowered and the transistor M1 enters the ON state. The voltage of the local bit line LBL is boosted via the transistor M1, the node N1, the transistor M6, the node N4, and the transistor M7.

At time T2, the voltage of the local bit line LBL connected to the selected memory cell MC becomes a voltage Vonk (VUS<Vonk), and the voltage of the local source line LSL connected to the selected memory cell MC becomes the voltage Vss. As a result, a voltage (voltage Vonk−voltage Vss) is applied to the selected memory cell MC. In the present embodiment, the absolute value of the voltage (voltage Vonk−voltage Vss) exceeds the voltage Vth. Thereafter, the voltage applied to the selected memory cell MC is maintained at Vhold. Therefore, the selected memory cell MC enters the ON state. It is considered that the voltage Vonk can be generated (or transferred) by, for example, the transistor M1. In the present embodiment, the transistor M1 is designed to supply the selected memory cell MC with the voltage Vonk such that the absolute value of the voltage (voltage Vonk−voltage Vss) exceeds the voltage Vth. The voltage (voltage Vonk−voltage Vss) is a voltage at which data is not written in the selected memory cell MC. Further, since the selected memory cell MC is in the ON state, the cell current increases and the absolute value of the voltage applied to the selected memory cell MC decreases. Therefore, the transistor M1 is designed to maintain the voltage Vhold or higher in such a state.

The voltage Vss is applied to the non-selected memory cells MC and the second half-selected memory cells MC. The voltage Vss is lower than the voltage Vhold required for switching the memory cell MC to the ON state. Therefore, the non-selected memory cells MC and the second half-selected memory cells MC maintain the OFF state. Further, in the first half-selected memory cell MC, a voltage obtained by subtracting the voltage of the non-selected local source line LSL from the voltage of the selected local bit line LBL is applied. That is, a voltage (voltage Vonk−voltage VUS) is applied to the first half-selected memory cell MC. In the present embodiment, the absolute value of the voltage (voltage Vonk−voltage VUS) does not exceed the voltage Vth. Therefore, the first half-selected memory cell MC maintains the OFF state. The transistor M1 is designed to supply the selected memory cell MC with the voltage Vonk such that the absolute value of this voltage (voltage Vonk−voltage VUS) does not exceed the voltage Vth.

The current flowing through the selected memory cell MC from time T2 to time T3 is labeled as current Icell_1st. The voltage of the node N2 becomes the voltage V1st based on the current Icell_1st.

Figure 19:
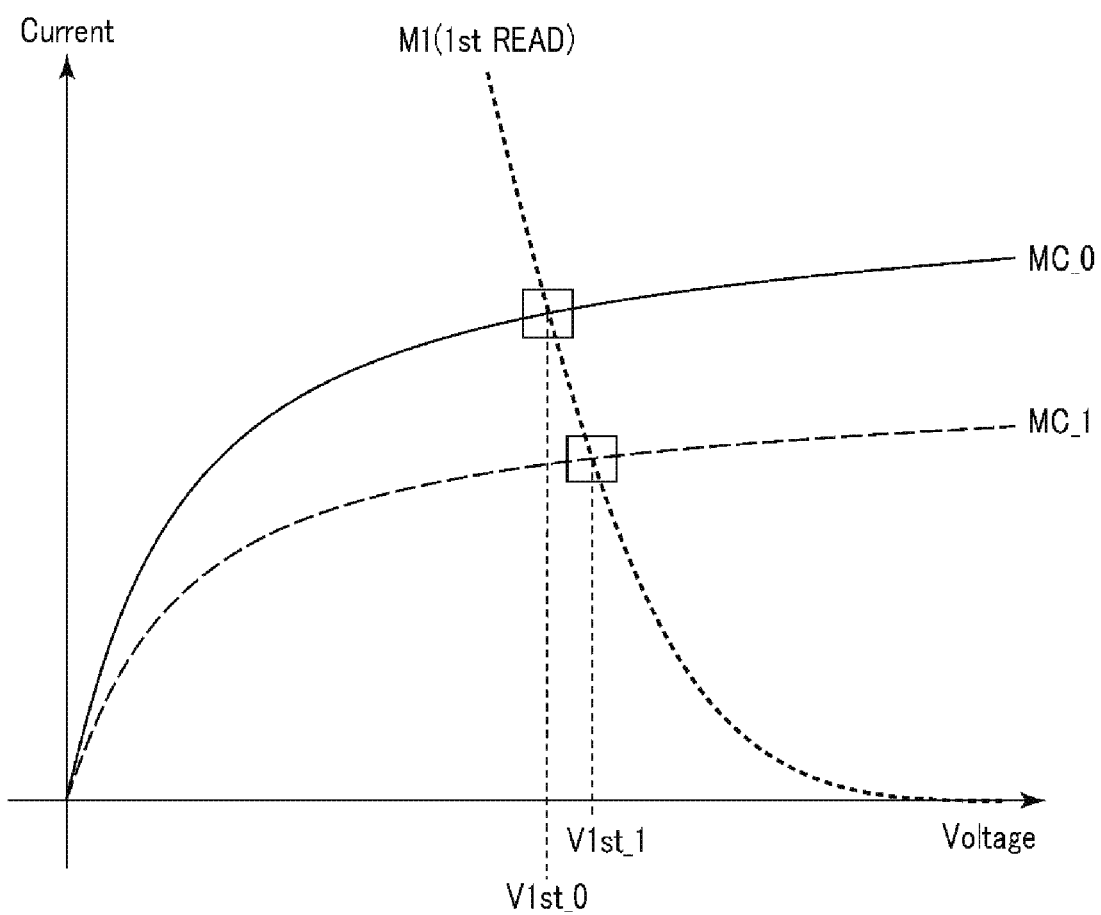
FIG. 19 is a diagram showing a relationship between a characteristic of a transistor in the preamplifier and a characteristic of the memory cell during a first read operation.

Here, the principle that the voltage V1st changes based on the data stored in the selected memory cell MC will be described with reference to FIG. 19. FIG. 19 shows a relationship between the characteristic of the transistor M1 during the first read operation (see M1 (1st READ) in the drawing) and the characteristics of the memory cell (see MC_0 and MC_1 in the drawing). In FIG. 19, the horizontal axis represents a voltage and the vertical axis represents a current.

As shown in FIG. 19, the voltage V1st when the selected memory cell MC stores "0" data (see MC_0 in the drawing) is the voltage corresponding to the intersection of MC_0 and M1 (1st READ) in the drawing. This voltage V1st is labeled as voltage V1st_0. In addition, the voltage V1st when the selected memory cell MC stores "1" data (see MC_1 in the drawing) is the voltage corresponding to the intersection of MC_1 and M1 (1st READ) in the drawing. This voltage V1st is labeled as voltage V1st_1. The voltage V1st_0 and the voltage V1st_1 have a relationship of voltage V1st_0<voltage V1st_1. That is, the voltage V1st changes according to the voltage stored in the selected memory cell MC at the time of step S1001.

[Time T3] to [Time T4]

Referring back to FIG. 17, the controller 15 lowers the signal REN and the signal SW1N to "L" level and raises the signal SW1P to "H" level in the "0" write operation (step S1002) from time T3 to time T4. Further, the write circuit 113 boosts the voltage of the selected local bit line LBL to a voltage Vwb (Vonk<Vwb) and lowers the voltage of the selected local source line LSL to the voltage Vss.

Figure 20:
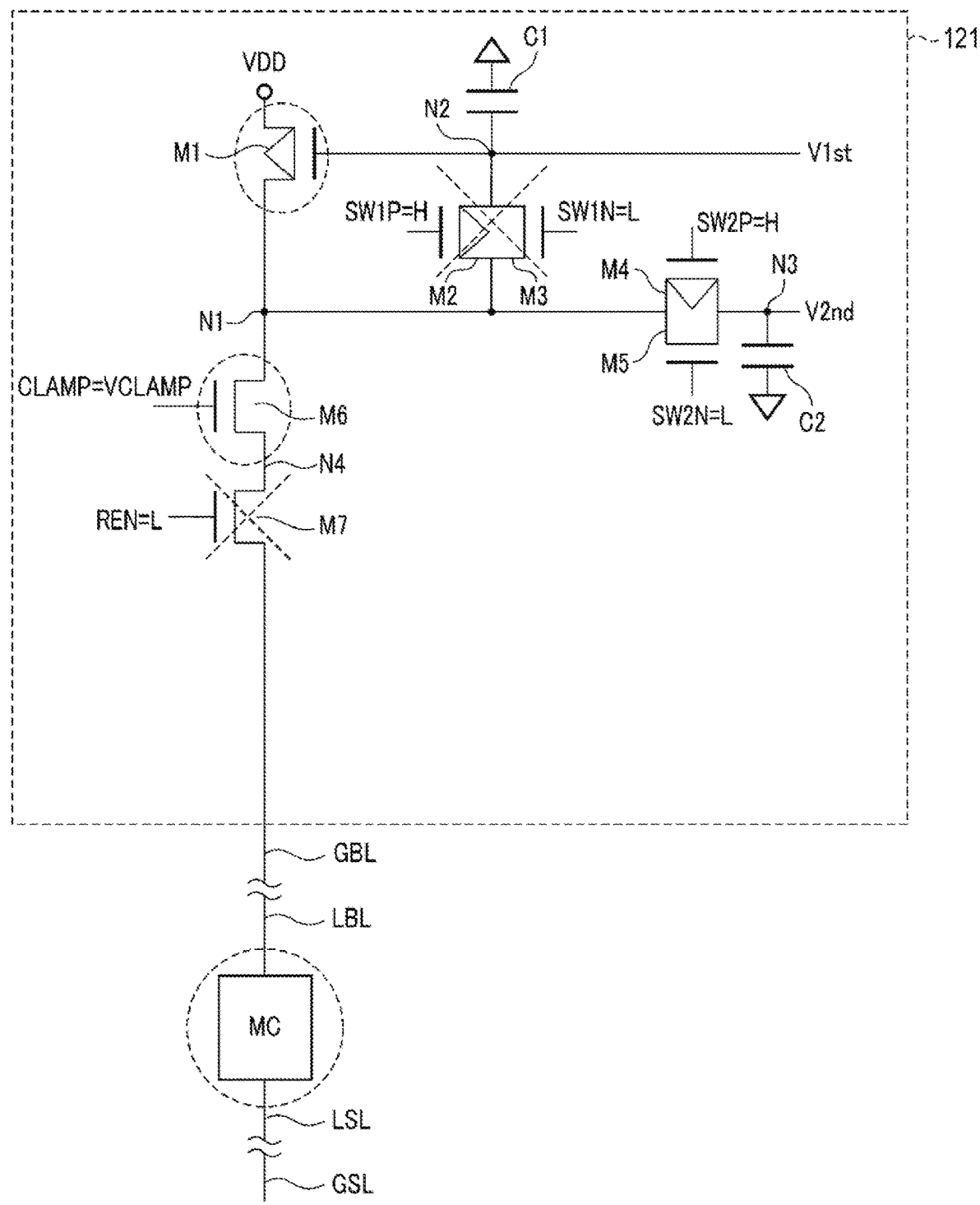
FIG. 20 is a circuit diagram illustrating an operation example of the preamplifier during a second time period depicted in FIG. 17.

Here, the preamplifier 121 from time T3 to time T4 in FIG. 17 will be described with reference to FIG. 20. FIG. 20 is a circuit diagram showing the preamplifier 121 from time T3 to time T4 in FIG. 17. As shown in FIG. 20, the transistors M2, M3, and M7 are in the OFF state. As a result, the voltage V1st is stored in the node N2.

Then, the write circuit 113 applies a "0" data write current in the same direction as the read in the "0" write operation (step S1002).

Specifically, the write circuit 113 boosts the voltage of the selected local bit line LBL to the voltage Vwb and lowers the voltage of the selected local source line LSL to the voltage Vss. Further, the write circuit 113 maintains the voltages of the non-selected local bit line LBL and the non-selected local source line LSL at the voltage VUS. The voltage Vwb is set so that a voltage (voltage Vwb−voltage Vss) is applied to the selected memory cell MC to write data to the selected memory cell MC.

As a result, the write circuit 113 writes "0" data to the selected memory cell MC.

[Time T4] to [Time T9]

Referring back to FIG. 17, in the second read operation (step S1003) at time T4, the controller 15 raises the signal REN and the signal SW2N to "H" level and lowers the signal SW2P to "L" level.

Figure 21:
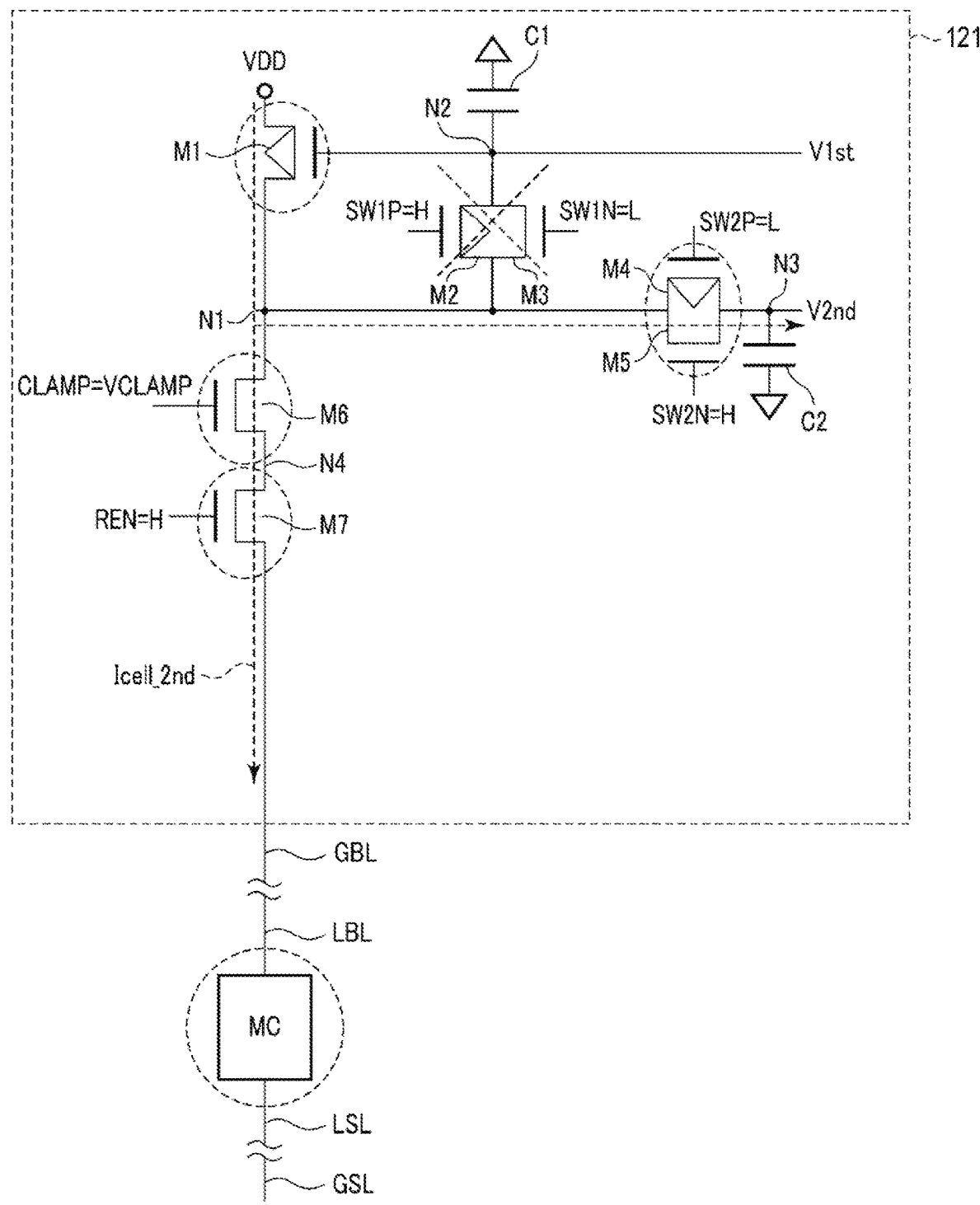
FIG. 21 is a circuit diagram illustrating an operation example of the preamplifier during a third time period depicted in FIG. 17.

Here, the preamplifier 121 from time T4 to time T6 in FIG. 17 will be described with reference to FIG. 21. FIG. 21 is a circuit diagram showing the preamplifier 121 from time T4 to time T6 in FIG. 17.

As shown in FIG. 21, the transistors M4, M5, M6, and M7 are in the ON state. Further, the transistor M1 transfers the voltage corresponding to the voltage V1st stored in the node N2 to the node N1.

The voltage of the local bit line LBL is boosted via the transistor M1, the node N1, the transistor M6, the node N4, and the transistor M7.

In step S1003, the state of the selected memory cell MC changes according to the data stored in the selected memory cell MC in step S1001.

When the selected memory cell MC stores "0" data in step S1001, at time T5, the voltage of the local bit line LBL connected to the selected memory cell MC(0) becomes the voltage Vonk1 (>voltage VUS), and the voltage of the local source line LSL connected to the selected memory cell MC(0) becomes the voltage Vss. As a result, the absolute value of the voltage (voltage Vonk1−voltage Vss) applied to the selected memory cell MC(0) is obtained. As a result, the selected memory cell MC(0) enters the ON state.

In addition, when the selected memory cell MC stores "1" data in step S1001, at time T5, the voltage of the local bit line LBL connected to the selected memory cell MC(1) becomes a voltage Vonk2 (>voltage VUS), and the voltage of the local source line LSL connected to the selected memory cell MC(1) becomes the voltage Vss. As a result, the absolute value of the voltage (voltage Vonk2−voltage Vss) applied to the selected memory cell MC(1) is obtained. As a result, the selected memory cell MC(1) enters the ON state.

Since the voltage Vss is applied to the non-selected memory cell MC and the second half-selected memory cell MC, the OFF state is maintained. Further, in the first half-selected memory cell MC, a voltage obtained by subtracting the voltage of the non-selected local source line LSL from the voltage of the selected local bit line LBL is applied. That is, the voltage (voltage Vonk−voltage VUS) is applied to the first half-selected memory cell MC. As a result, the first half-selected memory cell MC maintains the OFF state.

The current flowing through the selected memory cell MC from time T5 to time T6 is labeled as current Icell_2nd. Then, the voltage of the node N3 becomes the voltage V2nd based on the current Icell_2nd.

Figure 22:
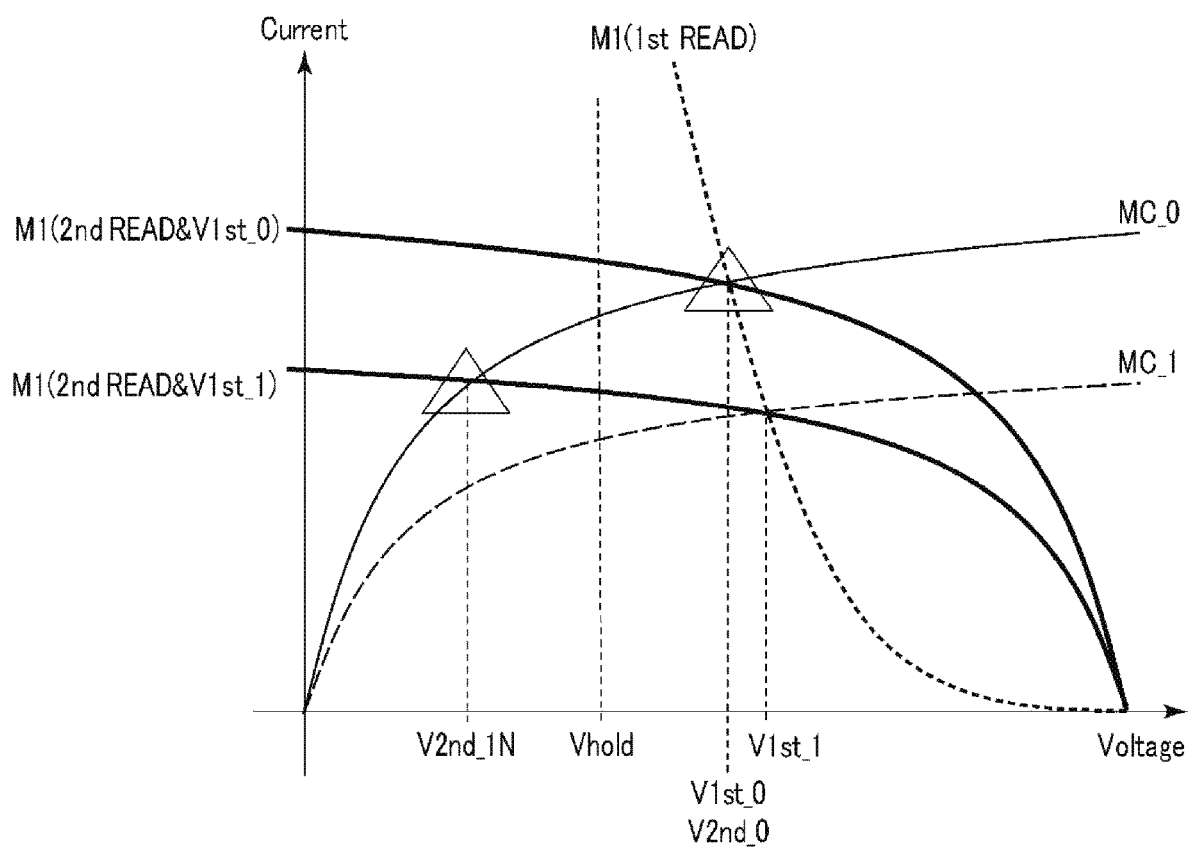
FIG. 22 is a diagram showing a relationship between a characteristic of the transistor in the preamplifier and a characteristic of the memory cell during a second read operation.
Figure 23:
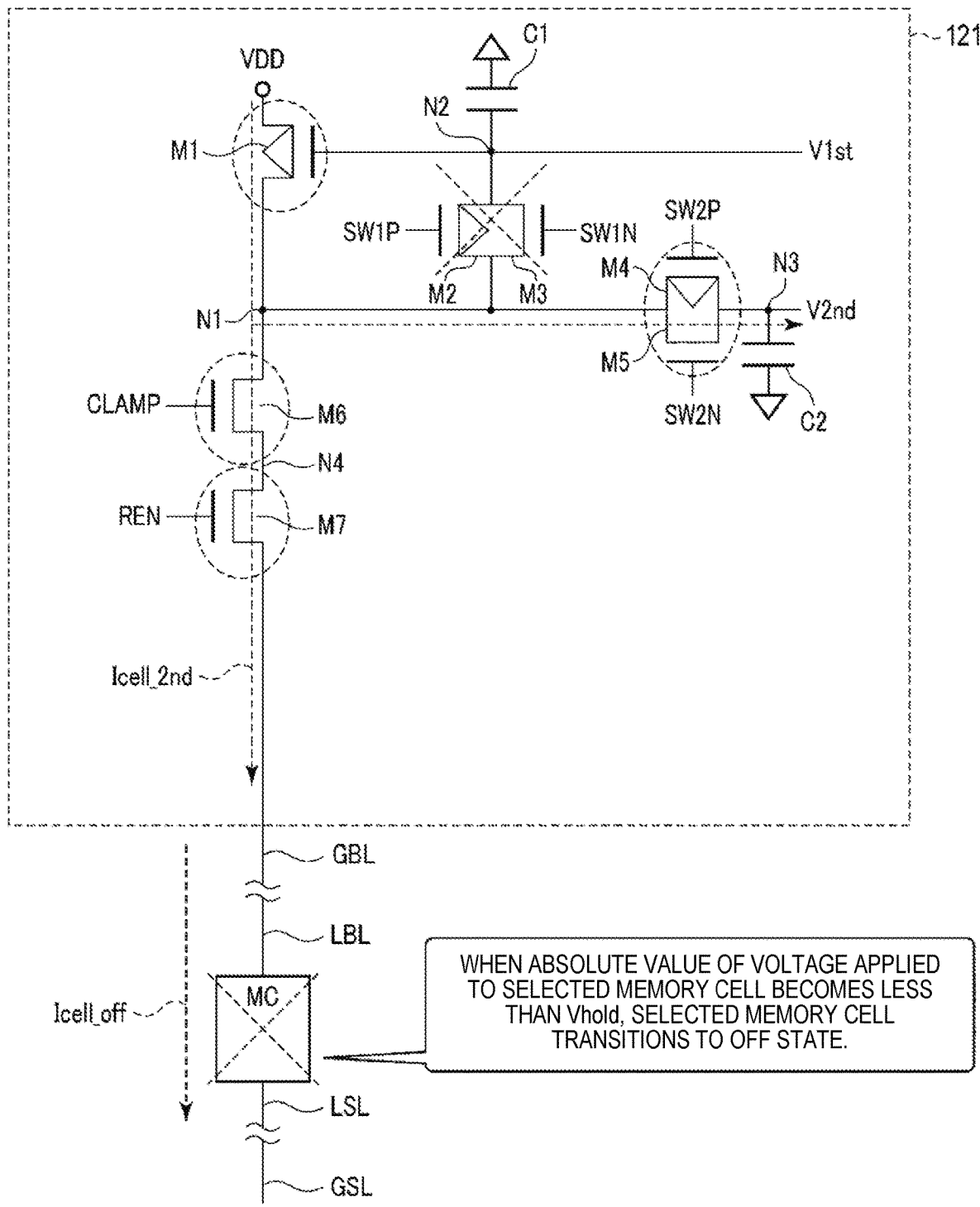
FIG. 23 is a circuit diagram illustrating an operation example of the preamplifier during a fourth time period depicted in FIG. 17.
Figure 24:
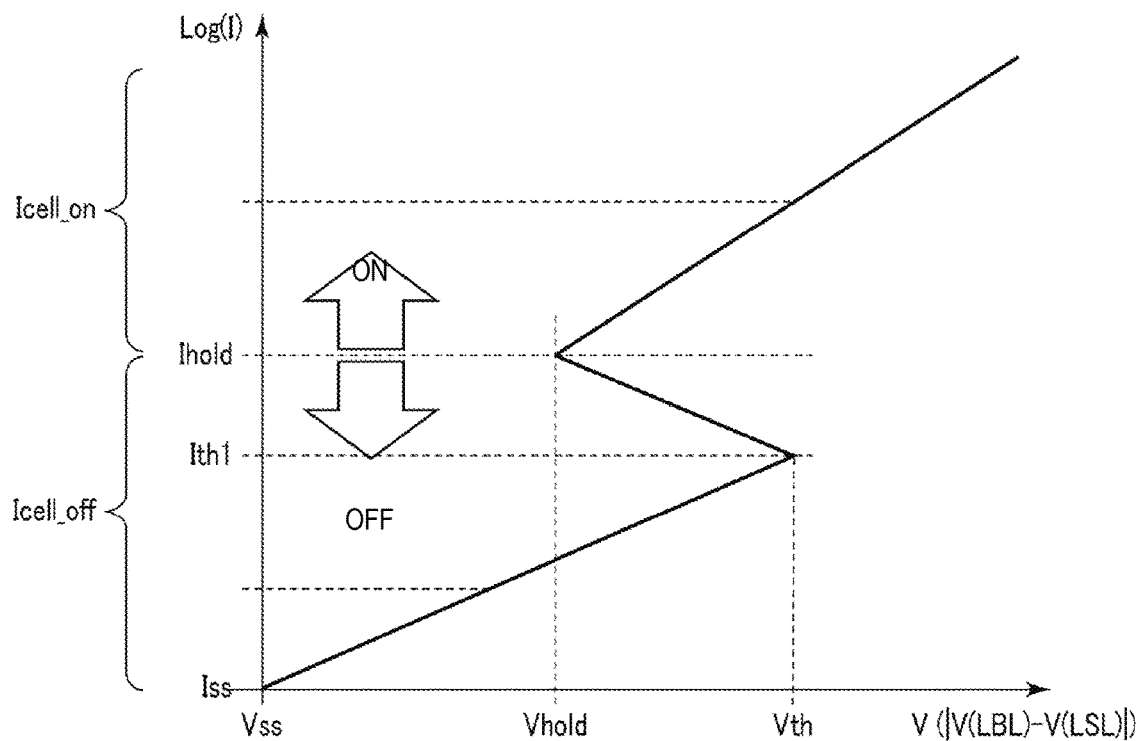
FIG. 24 is a graph showing a current-voltage characteristic of a selector.
Figure 25:
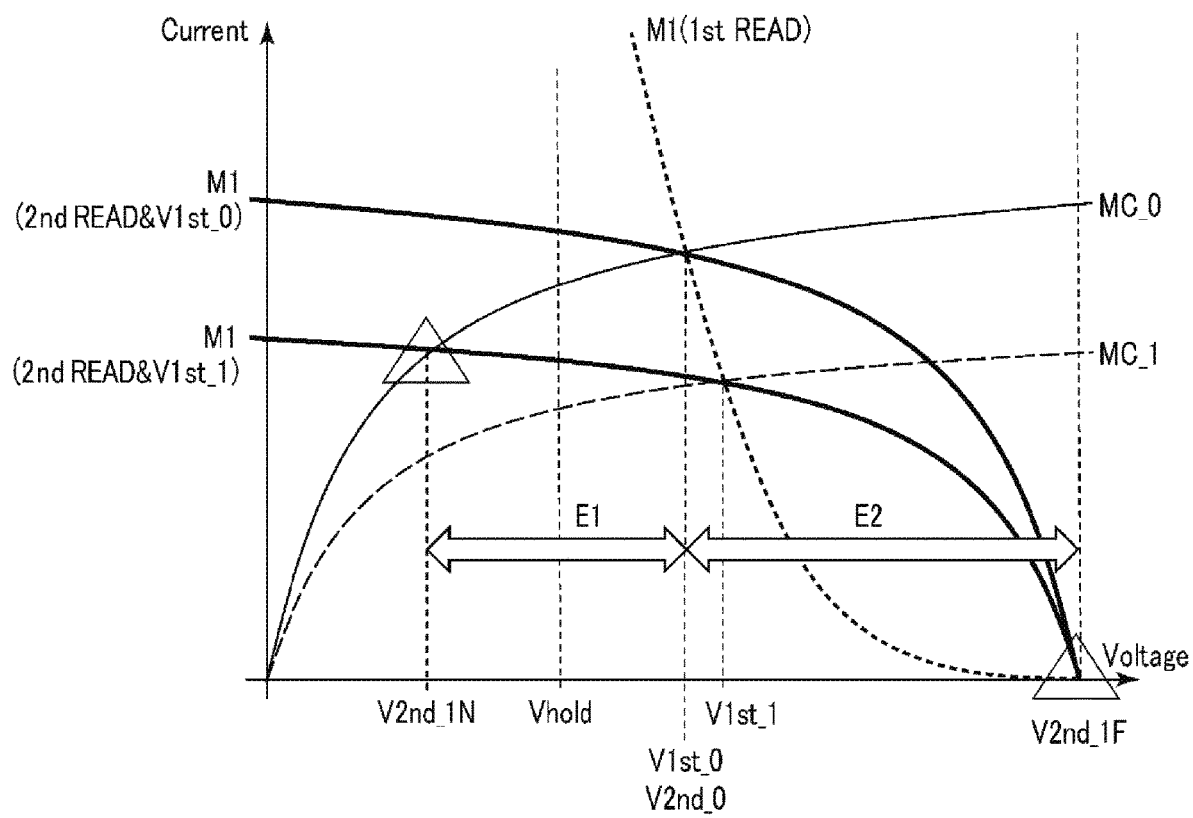
FIG. 25 is another diagram showing a relationship between the characteristic of the transistor in the preamplifier and the memory cell during the second read operation.

The principle that the voltage V2nd changes based on the voltage V1st will be described with reference to FIGS. 22 to 25. FIGS. 22 and 25 show relationships between the characteristic of the transistor M1 (see M1 (2nd READ & V1st_0) and M1 (2nd READ & V1st_1)) and the characteristic of the memory cell (at the time of 2nd READ, the selected memory cell MC stores "0" data, see MC_0 in FIG. 22) during the second read operation. FIG. 25 is a diagram when the selected memory cell MC is in the OFF state. FIG. 23 is a circuit diagram showing the preamplifier 121 from time T6 to time T7 in FIG. 17 and when the voltage V1st is the voltage V1st_0. FIG. 24 is a graph showing the current-voltage characteristic of the selector S.

In FIG. 22, the voltage V2nd when the selected memory cell MC stores "0" data in step S1001 is the voltage corresponding to the intersection of MC_0 and M1 (2nd READ & V1st_0) in the drawing. This voltage V2nd is labeled as voltage V2nd_0. The voltage V2nd when the selected memory cell MC stores "1" data in step S1001 is the voltage corresponding to the intersection of MC_0 and M1 (2nd READ & V1st_1) in the drawing. This voltage V2nd is labeled as voltage V2nd_1N. This voltage V2nd_1N is a voltage when the selected memory cell MC is in the ON state. The voltage V2nd_0 and the voltage V2nd_1N have a relationship of voltage V2nd_1N<voltage V2nd_0. Further, the voltage V2nd_0 and the voltage V1st_0 are substantially the same. That is, the voltage V2nd changes according to the voltage stored in the selected memory cell MC at the time of step S1001.

From time T7 to time T9, when the selected memory cell MC stores "1" data in step S1001, the same operation from time T5 to time T7 described above is repeated.

From time T5 to time T9, when the selected memory cell MC stores "0" data in step S1001, the voltage applied to the selected memory cell MC is a voltage (voltage V2nd_0-voltage Vss). As shown in FIG. 22, in the present embodiment, the absolute value of this voltage (voltage V2nd_0-voltage Vss) is equal to or higher than the voltage Vhold. Therefore, when the selected memory cell MC stores "0" data in step S1001, the selected memory cell MC maintains the on state.

The transistor M1 is designed such that, when the voltage V1st_0 is input to the gate electrode, the absolute value of the voltage (voltage V2nd_0-voltage Vss) is equal to or higher than the voltage Vhold.

On the other hand, when the selected memory cell MC stores "1" data in step S1001, the voltage applied to the selected memory cell MC is a voltage (voltage V2nd_1N-voltage Vss). As shown in FIGS. 22 and 23, in the present embodiment, the absolute value of the voltage (voltage V2nd_1N-voltage Vss) is equal to or lower than the voltage Vhold. When the absolute value of the voltage applied to the selected memory cell MC becomes lower than the voltage Vhold, the selected memory cell MC transitions to the OFF state. Therefore, the selected memory cell MC transitions from the ON state to the OFF state (time T6).

The transistor M1 is designed such that, when the voltage V1st_1 is input to the gate electrode, the absolute value of the voltage (voltage V2nd_1N-voltage Vss) is equal to or lower than the voltage Vhold.

Here, the case where the selected memory cell MC stores "1" data in step S1001 and the selected memory cell MC enters the OFF state during the second read operation (step S1003) will be described.

As shown in FIGS. 23 and 24, from time T6 to time T8, the current (for example, Icell_off) flowing through the selected memory cell MC in the OFF state has a lower current value than the current (for example, Icell_on) flowing through the selected memory cell MC in the ON state. The current I2nd flowing through the transistor M1 is higher than the current Icell_off. When the selected memory cell MC is in the ON state, the current flowing through the node N3 is the current I2nd−current Icell_on, and when the selected memory cell MC is in the ON state, the current flowing through the node N3 is the current I2nd−current Icell_off. As described above, the current Icell_off is lower than the current Icell_on. The current flowing through the node N3 is higher when the selected memory cell MC is in the OFF state than when the selected memory cell MC is in the ON state. That is, the voltage supplied to the node N3 is higher when the selected memory cell MC is in the OFF state than when the selected memory cell MC is in the ON state.

As a result, as shown in FIG. 25, the voltage of the node N3 (voltage V2nd) becomes higher than the voltage Vhold. In this way, the voltage V2nd_1 when the selected memory cell MC is in the OFF state is labeled as voltage V2nd_1F. As a result, the voltage V2nd_1F in the OFF state of the selected memory cell MC storing "1" data in step S1001 becomes higher than the voltage V2nd_1N in the ON state.

Further, as shown in FIG. 25, an absolute value E2 of the difference between the voltage V2nd_0 and the voltage V2nd_1F is larger than an absolute value E1 of the difference between the voltage V2nd_0 and the voltage V2nd_1N. As will be described later, if the absolute value E2 of the difference between the voltage V2nd_0 and the voltage V2nd_1F is large, a sufficient read margin can be secured.

In order to determine the result of the voltage V1st generated in step S1001, it is necessary to compare the voltage V1st_0 and the voltage V2nd_0 or the voltage V1st_1 and the voltage V2nd_1F. However, as shown in FIG. 25, the voltage V1st_0 and the voltage V2nd_0 are substantially the same. Therefore, it is not possible to compare which of the voltage V1st_0 and the voltage V2nd_0 is higher. Therefore, it is necessary to shift the voltage V1st or the voltage V2nd. Alternatively, it is necessary to shift the current related to the voltage V1st or the current related to the voltage V2nd.

In the present embodiment, the current related to the voltage V1st or the current related to the voltage V2nd is shifted. However, the present embodiment can be applied even when the voltage V1st or the voltage V2nd is shifted.

Figure 26:
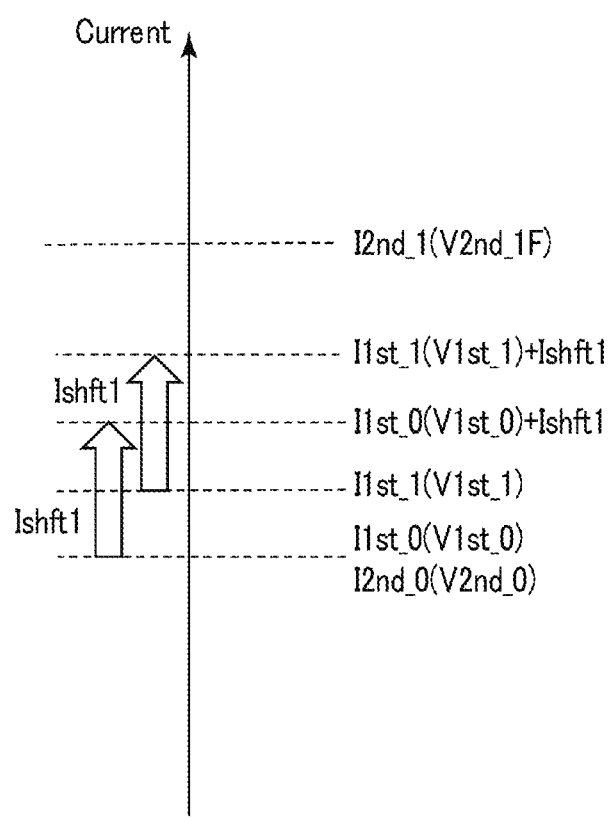
FIG. 26 is a diagram showing a relationship between currents generated during the read operation.

The relationship between the current I1st related to the voltage V1st and the current I2nd related to the voltage V2nd will be described with reference to FIG. 26. FIG. 26 is a diagram showing the relationship between the current I1st related to the voltage V1st and the current I2nd related to the voltage V2nd.

As shown in FIG. 26, the current based on the voltage V1st_0 is labeled as current I1st_0. The current based on voltage V1st_1 is labeled as current I1st_1. The current based on the voltage V2nd_0 is labeled as current I2nd_0. The current based on the voltage V2nd_1F is labeled as current I2nd_1.

As shown in FIG. 26, the current I1st_0 and the current I2nd_0 are substantially the same. Therefore, a shift current Ishft1 is added to the current I1st_0. Adding the shift current Ishft1 only to the current I1st_0 becomes complicated in terms of circuit design. Therefore, the shift current Ishft1 is added to the current I1st_1.

In step S1004, the current I2nd_0 is compared with the current I1st_0+current Ishft1 or the current I2nd_1 is compared with the current I1st_1+current Ishft1. At the start of step S1004, it is not determined whether the current I2nd is the current I2nd_0 or the current I2nd_1. However, by comparing the current I2nd with the current I1st+current Ishft1, it becomes clear whether the current I2nd is the current I2nd_0 or the current I2nd_1. Specifically, when the current I2nd is lower than the current I1st+current Ishft1, it is determined that the current I2nd is the current I2nd_0. Further, specifically, when the current I2nd is higher than the current I1st+current Ishft1, it is determined that the current I2nd is the current I2nd_1. Hereinafter, a specific operation for performing such an operation will be described.

From [Time T8] Onward

Referring back to FIG. 17, in the determination operation (step S1004), the controller 15 lowers the signal REN and the signal SW2N to "L" level and raises the signals SW2P, the signal SEN, and the signal SEN2 to "H" level.

As a result, the transistors M4 and M5 enter the OFF state. As a result, the node N3 stores the voltage V2nd.

Figure 27:
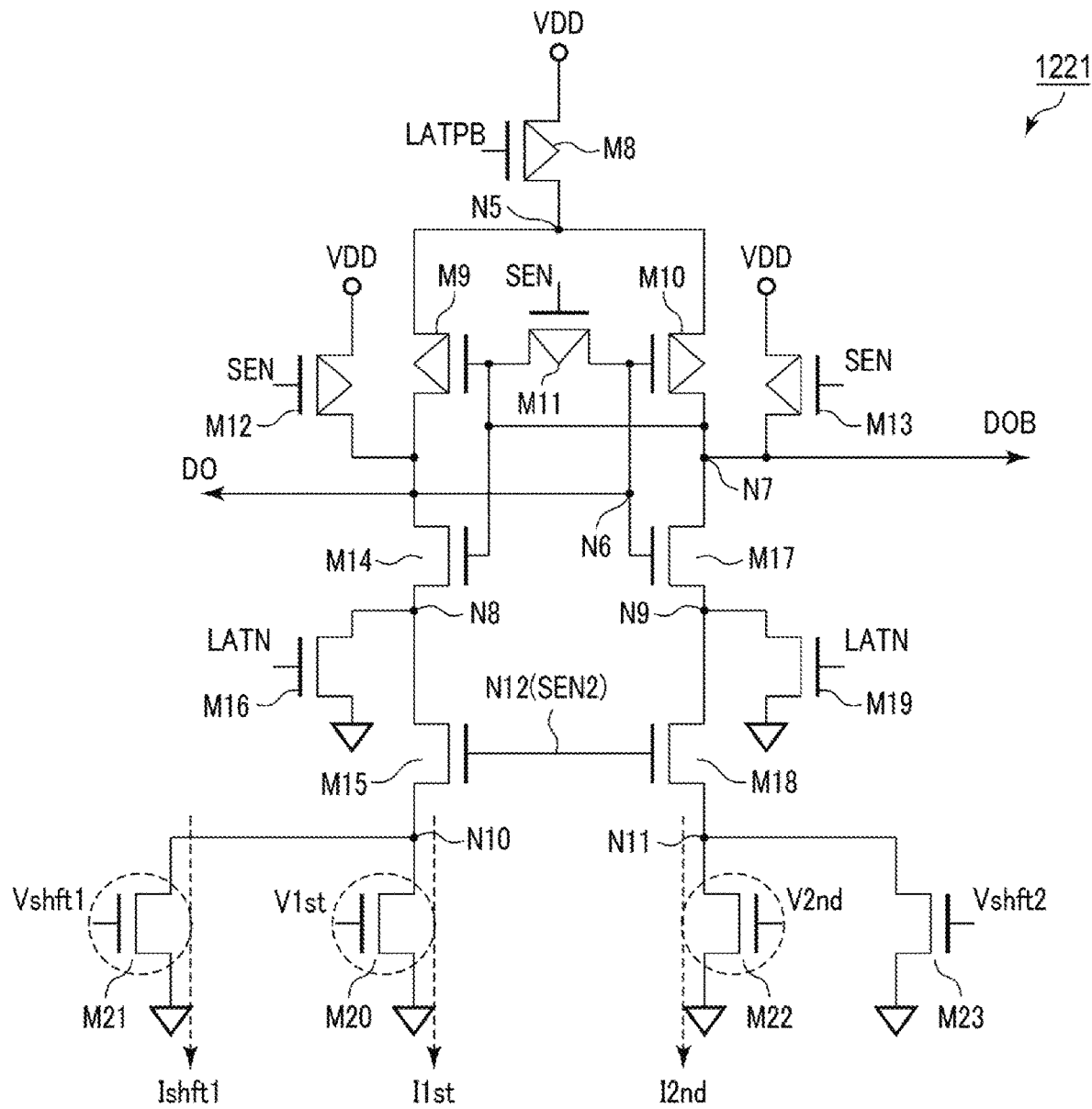
FIG. 27 is a circuit diagram illustrating an operation example of the amplification unit during a time period depicted in FIG. 17.

Here, the amplification unit 1221 from time T8 onward in FIG. 17 will be described with reference to FIG. 27. FIG. 27 is a circuit diagram showing the amplification unit 1221 from time T8 onward in FIG. 17. As shown in FIG. 27, the transistors M9 to M15, M17, M18, M20, M21, and M22 of the amplification unit 1221 are in the ON state. In addition, the transistor M23 is in the OFF state.

As a result, the transistor M20 passes the current I1st corresponding to the voltage V1st. The transistor M21 passes the shift current Ishft1 corresponding to the signal Vshft1. Further, the transistor M22 passes the current I2nd corresponding to the voltage V2nd.

At time T9, the controller 15 sets the signal SEN to "H" level, whereby the transistors M12 and M13 enter the OFF state, and the current supply from the transistors M12 and M13 is cut off. As a result, the voltage of the node N6 is determined based on the current I1st and the shift current Ishft1. The voltage of the node N7 is determined based on the current I2nd. This causes a voltage difference between the node N6 and the node N7, and the voltage difference increases at once due to the positive feedback of the transistors M9, M10, M14, and M17.

As a result, the amplification unit 1221 determines the signal DO and the signal DOB. Then, the comparison unit 1222 compares the signal DO and the signal DOB.

Then, at time T9, the controller 15 sets the signal LATPB to "L" level and the signal LAIN to "H" level. This completes the read operation.

<1-3> Effects

The semiconductor storage device 1 according to the embodiment described above includes the transistor M1 that supplies a current to the memory cell MC so that the first memory cell MC storing the first data during the first read operation maintains the ON state in the second read operation of the self-reference read method and the first memory cell MC storing the second data different from the first data during the first read operation transitions from the ON state to the OFF state.

Effects will be described with reference to FIG. 25. As shown in FIG. 25, the voltage V2nd when the memory cell MC storing "1" data during the first read operation is in the ON state becomes the voltage V2nd_1N (voltage V2nd_1N<voltage Vhold). Further, the voltage V2nd when the memory cell MC storing "1" data during the first read operation is in the OFF state becomes the voltage V2nd_1F (voltage V2nd_1N<voltage Vhold<voltage V2nd_1F). Then, the voltage V2nd when the memory cell MC storing "0" data during the first read operation is in the ON state becomes the voltage V2nd_0 (voltage Vhold<voltage V2nd_0<voltage V2nd_1F).

As shown in FIG. 25, the absolute value E2 of the difference between the voltage V2nd_1F and the voltage V2nd_0 is larger than the absolute value E1 of the difference between the voltage V2nd_1N and the voltage V2nd_0.

Considering variations due to various factors of the semiconductor storage device 1, it is desirable that the absolute value of the difference between the voltage V2nd_1 and the voltage V2nd_0 is large. If the absolute value of the difference between the voltage V2nd_1 and the voltage V2nd_0 is small, there is a possibility that the data cannot be properly determined due to the variations. Further, in order to determine the data, it is necessary that the currents based on the voltage V2nd_1 and the voltage V2nd_0 have a sufficient difference. Therefore, if the absolute value of the difference between the voltage V2nd_1 and the voltage V2nd_0 is small, it is necessary to wait until the current based on the voltage V2nd_1 and the current based on the voltage V2nd_0 converge. In that case, it may take time until the currents converge.

However, according to the above-described embodiment, the read margin can be increased by increasing the absolute value of the difference between the voltage V2nd_1 and the voltage V2nd_0. Therefore, the data determination can be performed at an earlier stage compared to when the absolute value of the difference between the voltage V2nd_1 and the voltage V2nd_0 is small. As a result, it is possible to speed up the read operation.

As a result, the semiconductor storage device 1 that employs the selector S for the memory cell MC can appropriately perform the read operation.

<2> Second Embodiment

A second embodiment will be described. In the second embodiment, the case where the preamplifier 121 is provided with a transistor for correcting the voltage V2nd will be described. The basic configuration and basic operation of the device according to the second embodiment are the same as those of the device according to the above-described embodiment. Therefore, a description of the matters described in the above-described embodiment will be omitted.

<2-1> Assumption

Figure 28:
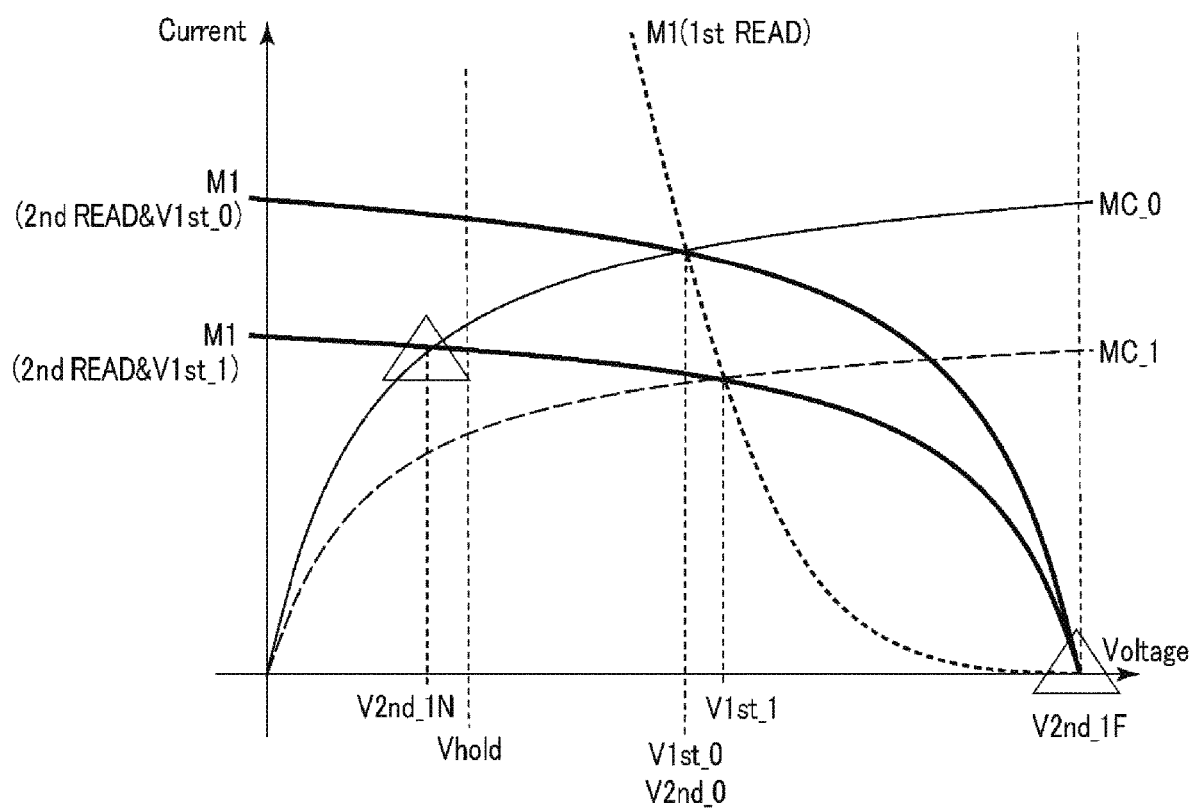
FIG. 28 is another diagram showing a relationship between the characteristic of the transistor in the preamplifier and the characteristic of the memory cell during the second read operation.

The case where the voltage Vhold and the voltage V2nd_1N have no sufficient margin will be described with reference to FIG. 28. FIG. 28 shows a relationship between the characteristic of the transistor M1 (see M1 (2nd READ & V1st_0) and M1 (2nd READ & V1st_1)) and the characteristic of the memory cell (at the time of 2nd READ, the selected memory cell MC stores "0" data, see MC_0 in FIG. 22) during the second read operation. [0188] As shown in FIG. 28, when there is not sufficient margin between the voltage Vhold and the voltage V2nd_1N, the voltage V2nd_1N may not be lower than the voltage Vhold due to fluctuations. In this case, during the second read operation of the self-reference read method, the first memory cell MC storing the first data during the first read operation maintains the ON state, and the first memory cell MC storing the second data different from the first data during the first read operation may not be able to transition from the ON state to the OFF state. In that case, the effects of the first embodiment described above cannot be obtained.

Therefore, in the second embodiment, the preamplifier 121 capable of adjusting the voltage V2nd is proposed.

<2-2> Structure

Figure 29:
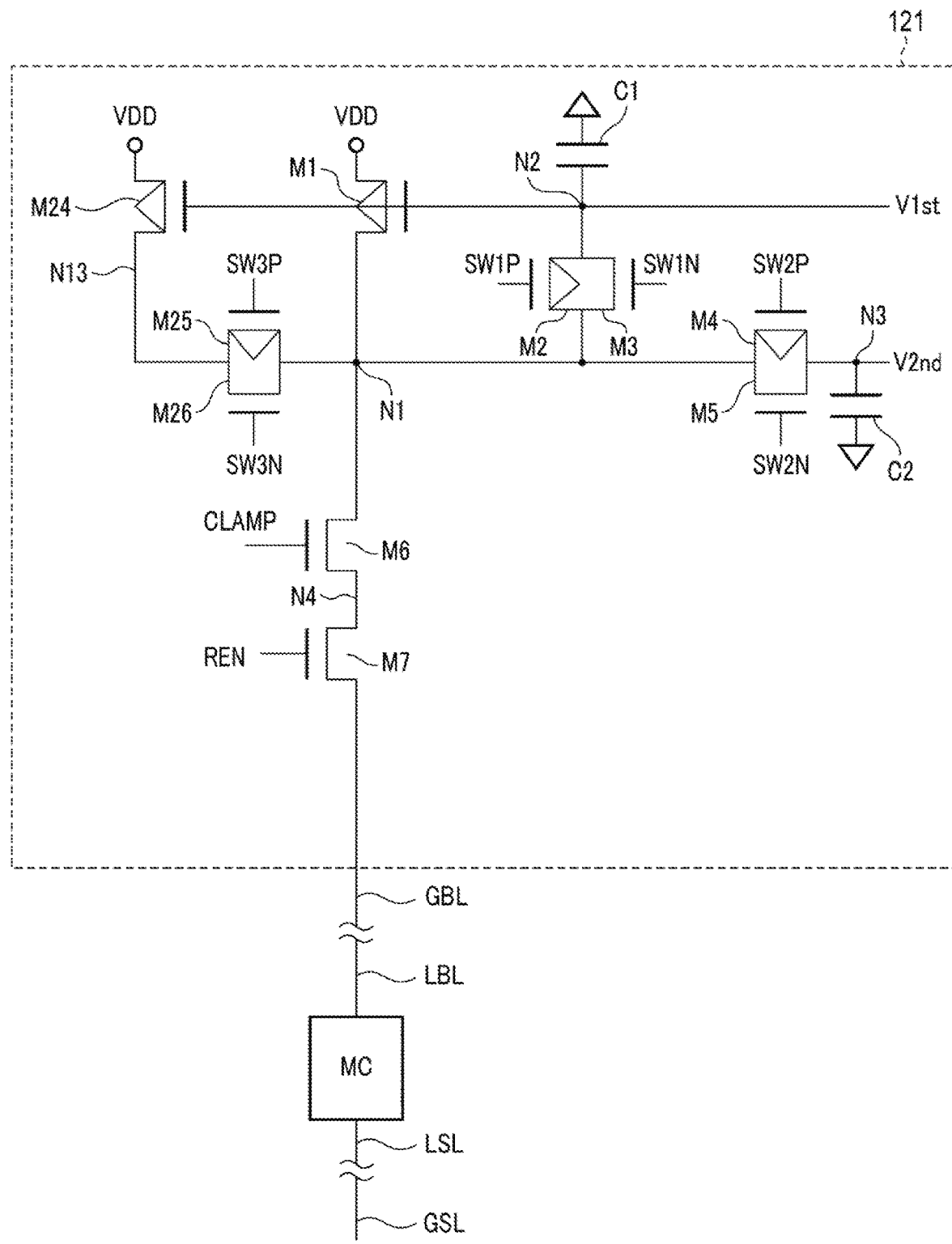
FIG. 29 is a circuit diagram showing a basic configuration of a preamplifier of a semiconductor storage device according to a second embodiment.

The configuration of the preamplifier 121 of the semiconductor storage device 1 according to the second embodiment will be described with reference to FIG. 29. FIG. 29 is a circuit diagram showing the basic configuration of the preamplifier 121 of the semiconductor storage device 1 according to the second embodiment.

As shown in FIG. 29, the preamplifier 121 includes PMOS transistors M1, M2, M4, M24, and M25, NMOS transistors M3, M5, M6, M7, and M26, and capacitors C1 and C2.

The power supply voltage VDD is applied to one end of the transistor M24, the other end is connected to a node N13, and the gate electrode is connected to the node N2.

One end of the transistor M25 is connected to the node N13, the other end is connected to the node N1, and the gate electrode is supplied with a signal SW3P.

One end of the transistor M26 is connected to the node N13, the other end is connected to the node N1, and the gate electrode is supplied with a signal SW3N.

The operation of the preamplifier 121 will be described later.

<2-3> Operation

Figure 30:
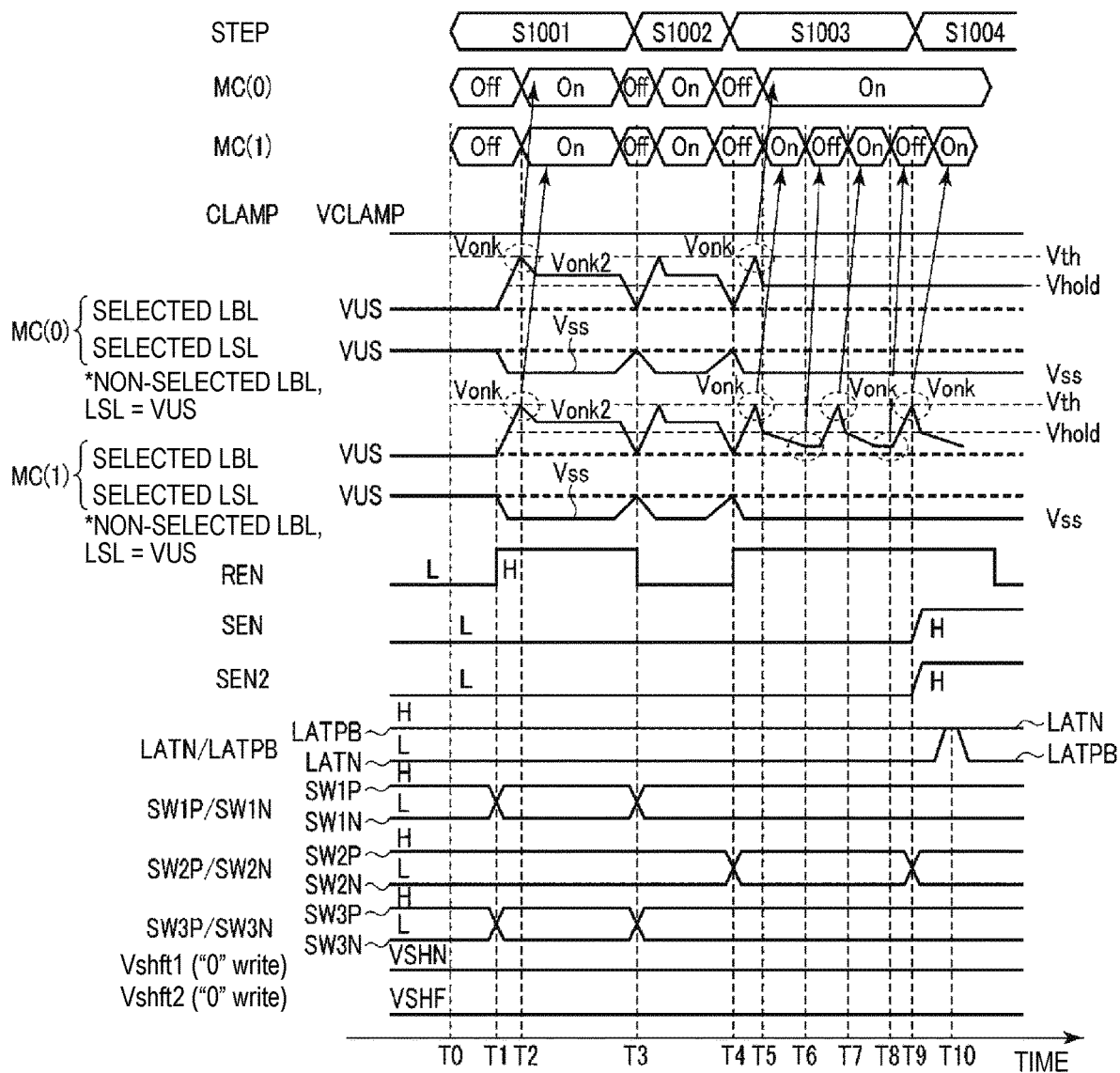
FIG. 30 is a waveform chart showing an example of a read operation of the semiconductor storage device according to the second embodiment.

A specific example of a read operation of the semiconductor storage device 1 according to the second embodiment will be described with reference to the waveform chart of FIG. 30. FIG. 30 is a waveform chart showing a specific example of the read operation of the semiconductor storage device 1 according to the second embodiment. FIG. 30 shows a time relationship between the steps shown in FIG.

16, the state of the selected memory cell MC (when "0" data is stored in step S1001 and when "1" data is stored in step S1001), and the voltages of the signal CLAMP, the local bit line LBL, the local source line LSL, the signal REN, the signal SEN, the signal SEN2, the signal LATN, the signal LATPB, the signal SW1P, the signal SW1N, the signal SW2P, the signal SW2N, the signal SW3P, the signal SW3N, the signal Vshft1, and the signal Vshft2. In FIG. 30, the selected memory cell MC when "0" data is stored in step S1001 is expressed as MC(0). Further, the selected memory cell MC when "1" data is stored in step S1001 is expressed as MC(1).

The voltage shown in FIG. 30 is either a voltage transferred from outside the semiconductor storage device 1 or a voltage generated inside the semiconductor storage device 1 (for example, the controller 15). The voltages of the signal CLAMP, the signal REN, the signal SEN, the signal SEN2, the signal LATN, the signal LATPB, the signal SW1P, the signal SW1N, the signal SW2P, the signal SW2N, the signal SW3P, the signal SW3N, the signal Vshft1, and the signal Vshft2 are voltages supplied from the controller 15. The voltage of the local bit line LBL is a voltage supplied from the read circuit 112 or the write circuit 113. The voltage of the local source line LSL is a voltage supplied from the write circuit 113.

[Time T0] to [Time T3]

In the ON operation at time T0 (step S1001), the controller 15 fixes the voltage of the signal CLAMP to an analog voltage having a constant value (for example, voltage VCLAMP). The voltage VCLAMP is, for example, a voltage that switches the transistor M6 to the ON state.

At time T0, the controller 15 sets the voltages of the signal REN, the signal SEN, the signal SEN2, the signal LATN, the signal SW1N, the signal SW2N, and the signal SW3N to "L" level, and sets the voltages of the signal LATPB, the signal SW1P, the signal SW2P, and the signal SW3P to "H" level. Further, the controller 15 sets the voltages of the local bit line LBL and the local source line LSL to the voltage VUS. The controller 15 fixes the voltage of the signal Vshft1 to an analog voltage having a constant value (for example, voltage VSHN). The voltage VSHN is, for example, a voltage that switches the transistor M21 to the ON state. Further, the controller 15 fixes the voltage of the signal Vshft2 to an analog voltage having a constant value (for example, voltage VSHF). The voltage VSHF is, for example, a voltage that switches the transistor M23 to the OFF state.

From time T0 to time T1, since the voltage applied to the selected memory cell MC is 0 V, which is lower than the voltage Vhold required to switch the selected memory cell MC to the ON state, the selected memory cell MC is in the OFF state.

In the ON operation at time T1 (step S1001), the controller 15 sets the signal REN, the signal SW1N, and the signal SW3N to "H" level and sets the signal SW1P and the signal SW3P to "L" level. Further, the controller 15 maintains the voltage of the non-selected local source line LSL at the voltage VUS and lowers the voltage of the selected local source line LSL to the voltage Vss.

Figure 31:
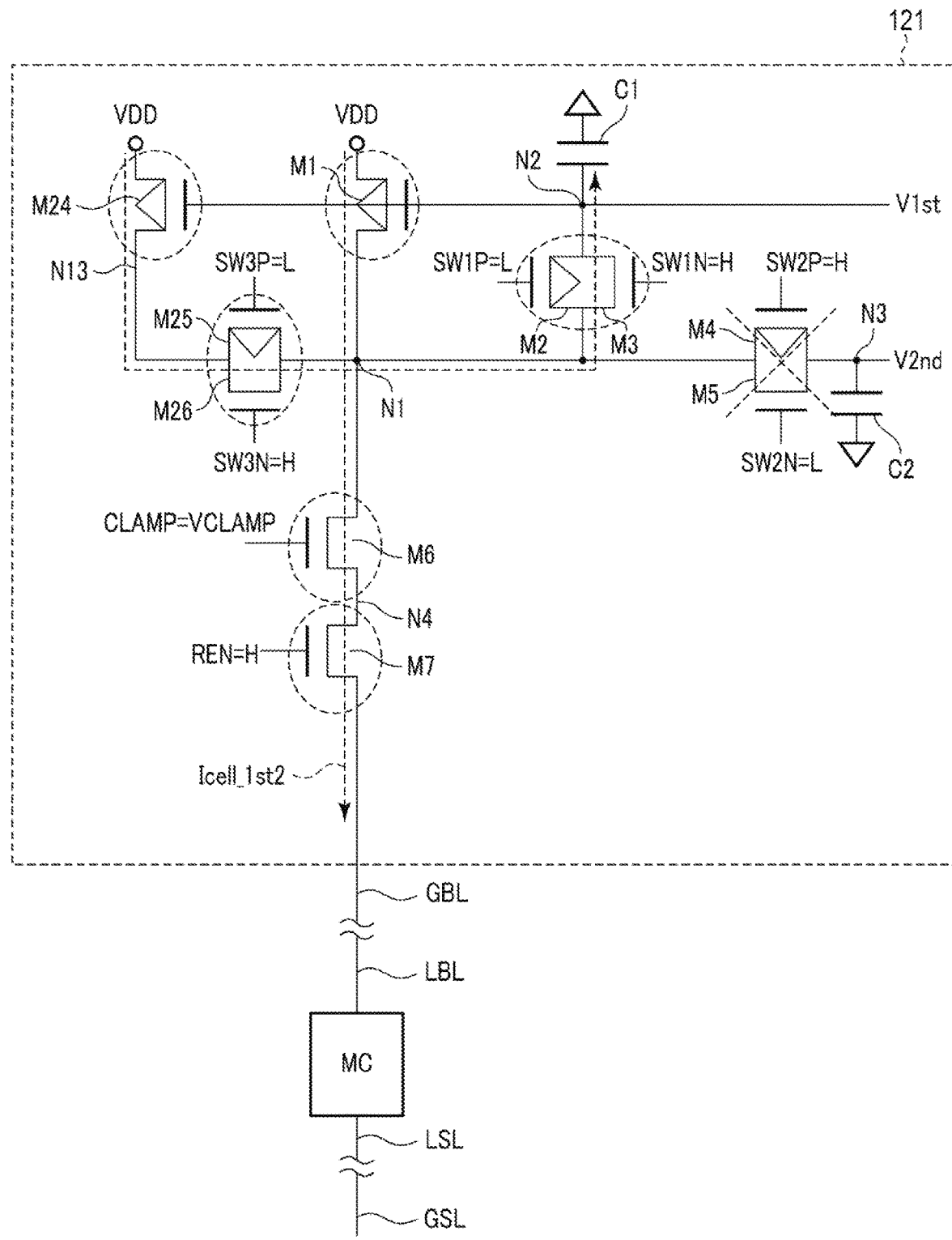
FIG. 31 is a circuit diagram illustrating an operation example of a preamplifier in the semiconductor storage device according to the second embodiment during a time period depicted in FIG. 30.

Here, the preamplifier 121 from time T1 to time T3 in FIG. 30 will be described with reference to FIG. 31. FIG. 31 is a circuit diagram showing the preamplifier 121 from time T1 to time T3 in FIG. 30.

As shown in FIG. 31, the transistors M2, M3, M6, M7, M25, and M26 are in the ON state. Further, the transistors M4 and M5 are in the OFF state. As a result, the node N1 is grounded (for example, voltage Vss) via the transistor M6, the node N4, the transistor M7, the global bit line GBL, the local bit line LBL, the memory cell MC, the local source line LSL, and the global source line GSL. As a result, the voltage of the node N1 decreases. Further, the voltage of the node N1 is transferred to the node N2 via the transistors M2 and M3. Therefore, the voltage of the node N2 is lowered and the transistors M1 and M24 are in the ON state. The voltage of the local bit line LBL is boosted via the transistor M1, the node N1, the transistor M24, the node N13, the transistors M25, M26, and M6, the node N4, and the transistor M7.

At time T2, the voltage of the local bit line LBL connected to the selected memory cell MC becomes the voltage Vonk, and the voltage of the local source line LSL connected to the selected memory cell MC becomes the voltage Vss. As a result, a voltage (voltage Vonk−voltage Vss) is applied to the selected memory cell MC. In the present embodiment, the absolute value of the voltage (voltage Vonk−voltage Vss) exceeds the voltage Vth. Then, the voltage applied to the selected memory cell MC is maintained at Vonk2 (Vhold<Vonk2). Therefore, the selected memory cell MC enters the ON state.

The voltage Vss is applied to the non-selected memory cells MC and the second half-selected memory cells MC. Therefore, the non-selected memory cells MC and the second half-selected memory cells MC maintain the OFF state. Further, the voltage (voltage Vonk−voltage VUS) is applied to the first half-selected memory cell MC. In the present embodiment, the absolute value of the voltage (voltage Vonk−voltage VUS) does not exceed the voltage Vth. Therefore, the first half-selected memory cell MC maintains the OFF state. The transistors M1 and M24 are designed to supply the selected memory cell MC with the voltage Vonk such that the absolute value of this voltage (voltage Vonk−voltage VUS) does not exceed the voltage Vth.

The current flowing through the selected memory cell MC from time T2 to time T3 is labeled as current Icell_1st2. The voltage of the node N2 becomes the voltage V1st based on the current Icell_1st2.

[Time T3] to [Time T4]

Referring back to FIG. 30, the controller 15 lowers the signal REN, the signal SW1N, and the signal SW3N to "L" level and raises the signal SW1P and the signal SW3P to "H" level in the "0" write operation (step S1002) from time T3 to time T4. Further, the write circuit 113 boosts the voltage of the selected local bit line LBL to a voltage Vwb (Vonk<Vwb) and lowers the voltage of the selected local source line LSL to the voltage Vss.

As a result, the write circuit 113 writes "0" data to the selected memory cell MC.

From [Time T4] Onward

The operation after time T4 is the same as the operation described in FIG. 17, and thus the description thereof is omitted.

<2-4> Effects

Figure 32:
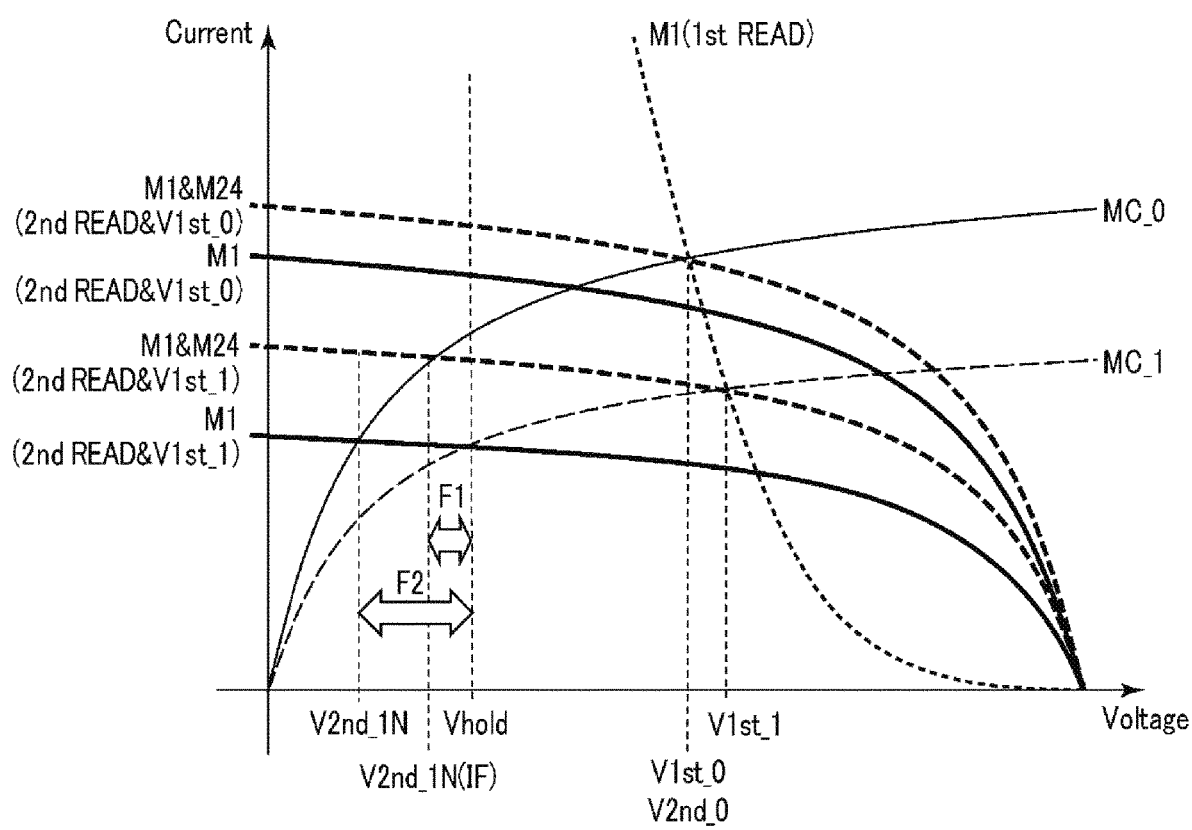
FIG. 32 is a diagram showing a relationship between a characteristic of a transistor in the preamplifier during a second read operation, characteristics of a pair of transistors in the preamplifier during the second read operation, and a characteristic of the memory cell.

The principle of changing the voltage V2nd based on the voltage V1st will be described with reference to FIG. 32. FIG. 32 shows a relationship between the characteristic of the transistor M1 during the second read operation, the characteristics of the transistors M1 and M24 during the second read operation, and the characteristic of the memory cell (at the time of 2nd READ, the selected memory cell MC stores "0" data, see MC_0 in FIG. 32). FIG. 32 is a diagram when the selected memory cell MC is in the ON state.

In the operation after the time T4, the transistors M25 and M26 are not in the ON state. During the first read operation, the transistors M1 and M24 were used to supply a voltage to the selected memory cell MC, but during the second read operation, the transistor M1 was used to supply a voltage to the selected memory cell MC. That is, during the second read operation, the voltage applied to the selected memory cell MC is shifted in the direction of decreasing the voltage. As a result, as shown in FIG. 32, the characteristic of the transistor M1 during the second read operation (see M1 (2nd READ & V1st_0) and M1 (2nd READ & V1st_1)) is different from the characteristics of the transistors M1 and M24 during the second read operation (see M1 & M24 (2nd READ & V1st_0) and M1 & M24 (2nd READ & V1st_1)).

When a voltage is supplied not only from the transistor M1 but also from the transistor M24 during the second read operation, a sufficient margin (see F1 in the drawing) between the voltage V2nd_1N (see V2nd_1N (IF) in the drawing) and the voltage Vhold cannot be secured, and the voltage V2nd_1N (IF) may not fall below the voltage Vhold. However, during the second read operation, the voltage supply from the transistor M24 is stopped. Therefore, a sufficient margin (see F2 in the drawing) between the voltage V2nd_1N and the voltage Vhold can be secured, and the voltage V2nd_1N can reliably fall below the voltage Vhold. Thus, the voltage V2nd can be adjusted by using the transistors M24 to M26. Then, the operation described in the first embodiment can be reliably performed.

<3 Modification Example 1
<3-1> Modification Example 1
<3-1-1> Configuration

The preamplifier 121 according to each of the above-described embodiments may include a transistor for switching the selected memory cell MC to the ON state. Hereinafter, as an example, the case where the preamplifier 121 is applied to the first embodiment will be described.

Figure 33:
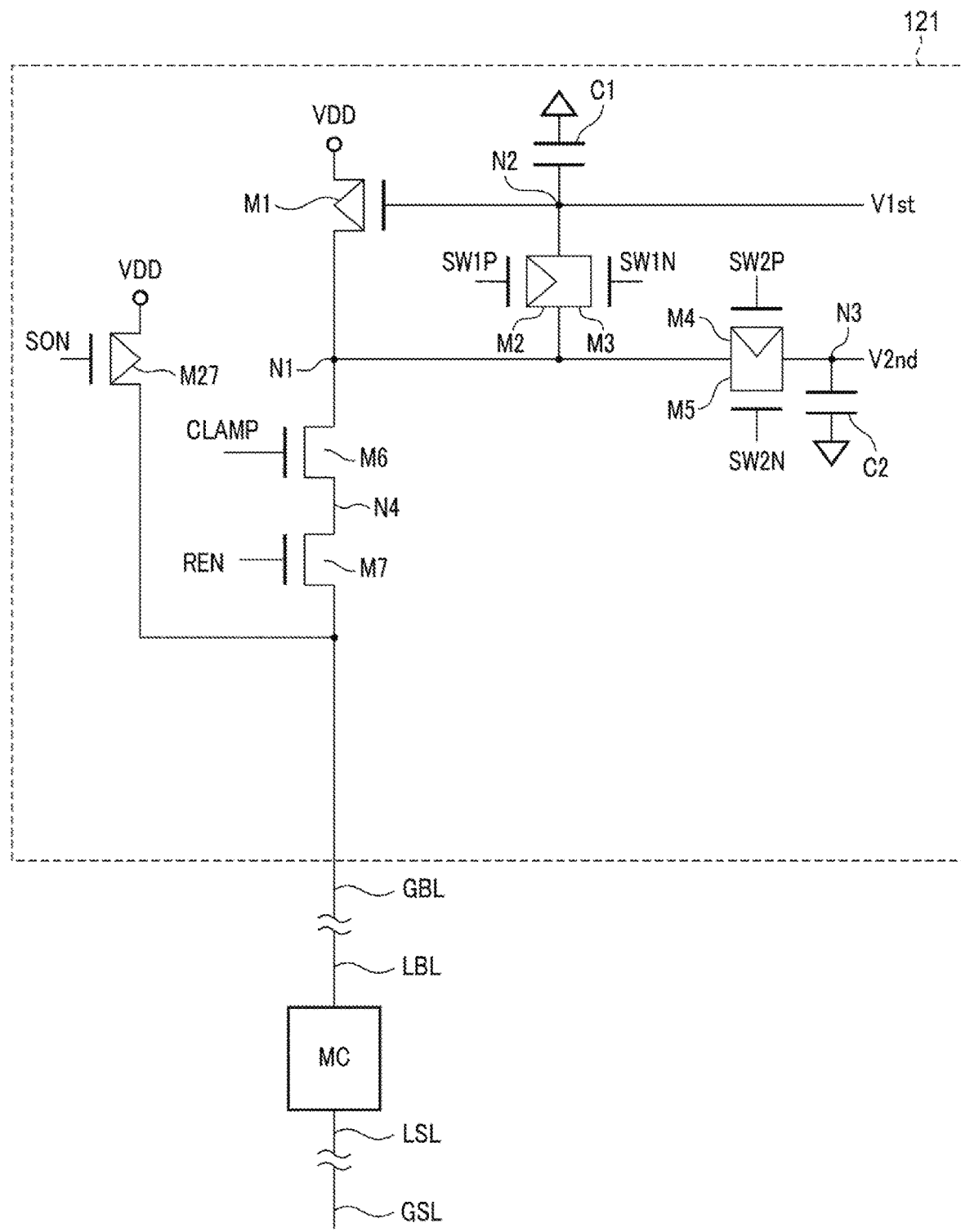
FIG. 33 is a circuit diagram showing a basic configuration of a preamplifier of a semiconductor storage device according to a modification example.

The configuration of the preamplifier 121 of the semiconductor storage device 1 according to Modification Example 1 will be described with reference to FIG. 33. FIG. 33 is a circuit diagram showing the basic configuration of the preamplifier 121 of the semiconductor storage device 1 according to Modification Example 1.

As shown in FIG. 33, the preamplifier 121 includes PMOS transistors M1, M2, M4, and M27, NMOS transistors M3, M5, M6, and M7, and capacitors C1 and C2.

The power supply voltage VDD is applied to one end of the transistor M27, the other end is connected to the global bit line GBL, and the gate electrode is supplied with a signal SON.

The operation of the preamplifier 121 will be described later.

<3-1-2> Specific Example of Read Operation

Figure 34:
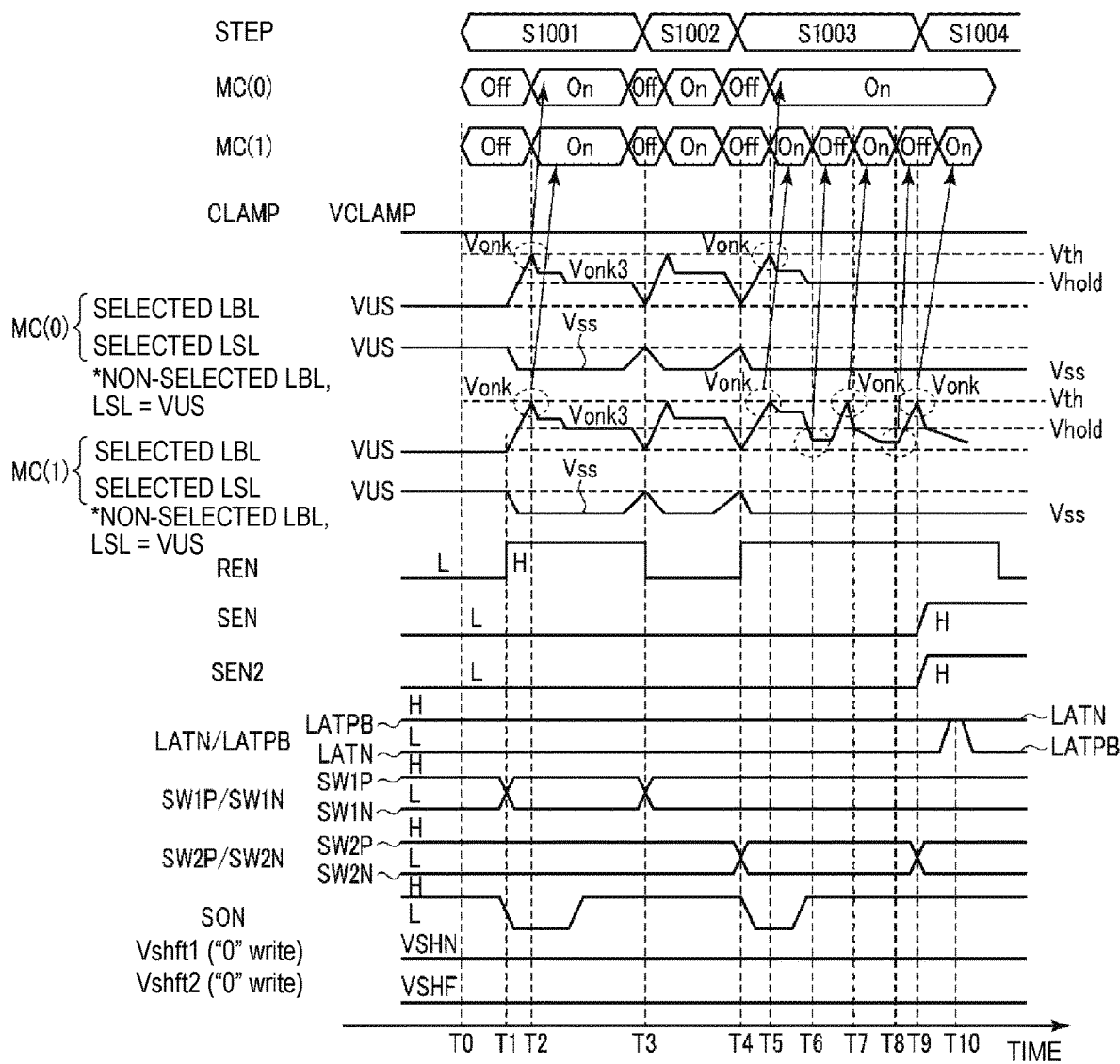
FIG. 34 is a waveform chart showing an example of the read operation of the semiconductor storage device according to the modification example.

A specific example of the read operation of the semiconductor storage device 1 according to Modification Example 1 will be described with reference to the waveform chart of FIG. 34. FIG. 34 is a waveform chart showing a specific example of the read operation of the semiconductor storage device 1 according to Modification Example 1. FIG. 34 shows a time relationship between the steps shown in FIG. 16, the state of the selected memory cell MC (when "0" data is stored in step S1001 and when "1" data is stored in step S1001), and the voltages of the signal SON, the signal CLAMP, the local bit line LBL, the local source line LSL, the signal REN, the signal SEN, the signal SEN2, the signal LAIN, the signal LATPB, the signal SW1P, the signal SW1N, the signal SW2P, the signal SW2N, the signal Vshft1, and the signal Vshft2. In FIG. 34, the selected memory cell MC when "0" data is stored in step S1001 is expressed as MC(0). Further, the selected memory cell MC when "1" data is stored in step S1001 is expressed as MC(1).

The voltage shown in FIG. 34 is either a voltage transferred from outside the semiconductor storage device 1 or a voltage generated inside the semiconductor storage device 1 (for example, the controller 15). The voltages of the signal SON, the signal CLAMP, the signal REN, the signal SEN, the signal SEN2, the signal LAIN, the signal LATPB, the signal SW1P, the signal SW1N, the signal SW2P, the signal SW2N, the signal Vshft1, and the signal Vshft2 are voltages supplied from the controller 15.

[Time T0] to [Time T3]

At time T2, the controller 15 sets the signal SON to "L" level.

Figure 35:
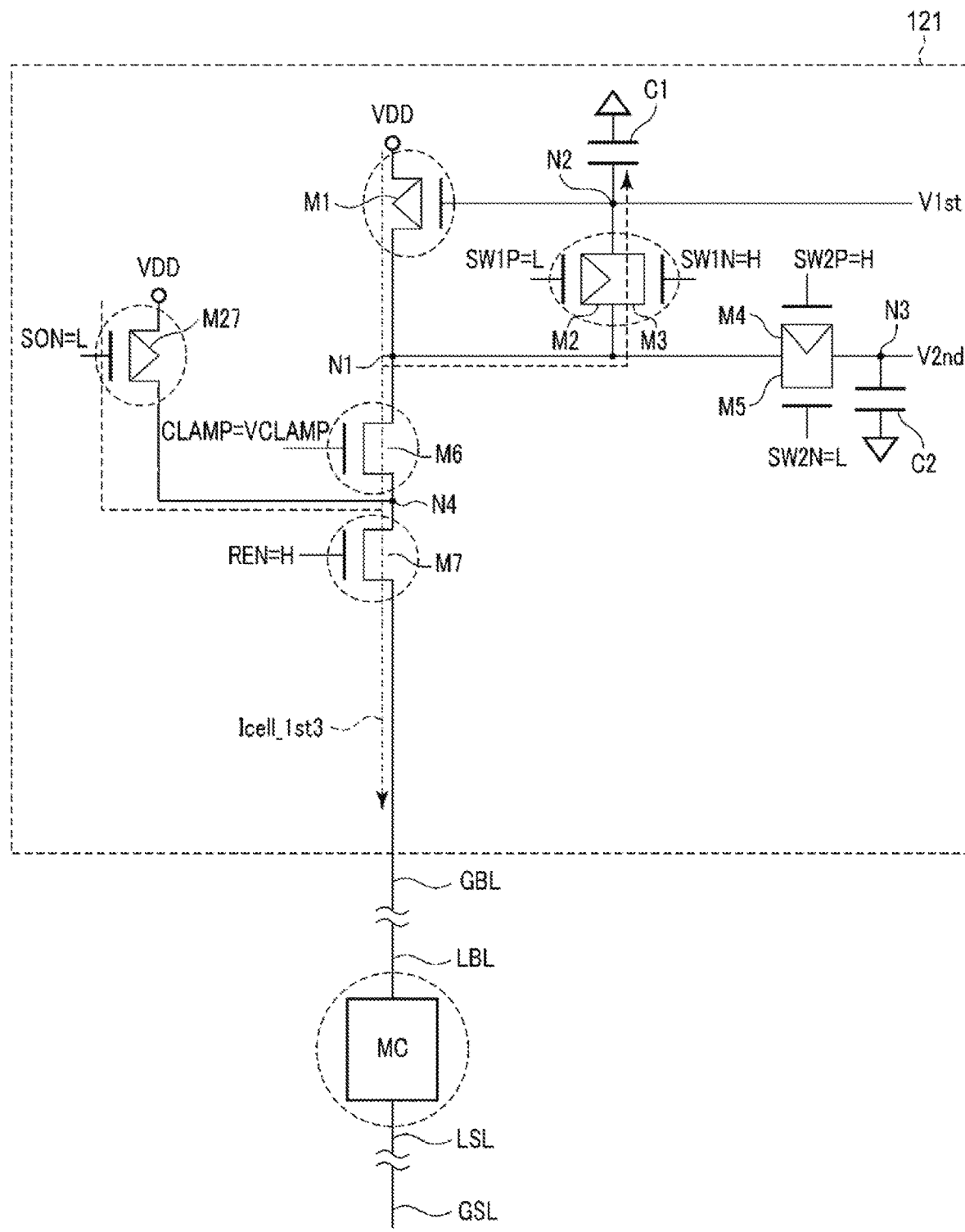
FIG. 35 is a circuit diagram showing an operation example of a preamplifier in the semiconductor storage device according to the modification example during a time period depicted in FIG. 34.

Here, the preamplifier 121 from time T2 to time T3 in FIG. 34 will be described with reference to FIG. 35. FIG. 35 is a circuit diagram showing the preamplifier 121 from time T2 to time T3 in FIG. 34.

As shown in FIG. 35, the transistors M1, M2, M3, M6, M7, and M27 are in the ON state. Further, the transistors M4 and M5 are in the OFF state. The voltage of the local bit line LBL is boosted via the transistor M1, the node N1, the transistor M6, the transistor M27, the node N4, and the transistor M7.

At time T2, the voltage of the local bit line LBL connected to the selected memory cell MC becomes the voltage Vonk, and the voltage of the local source line LSL connected to the selected memory cell MC becomes the voltage Vss. As a result, a voltage (voltage Vonk−voltage Vss) is applied to the selected memory cell MC. In the present embodiment, the absolute value of the voltage (voltage Vonk−voltage Vss) exceeds the voltage Vth. Then, the voltage applied to the selected memory cell MC is maintained at Vonk3 (Vhold<Vonk3). Therefore, the selected memory cell MC enters the ON state. The voltage Vonk can be considered to be generated (or transferred) by, for example, the transistors M1 and M27. In the present embodiment, the transistors M1 and M27 are designed to supply the selected memory cell MC with the voltage Vonk such that the absolute value of the voltage (voltage Vonk−voltage Vss) exceeds the voltage Vth. The voltage (voltage Vonk−voltage Vss) is a voltage at which data is not written in the selected memory cell MC.

The voltage Vss is applied to the non-selected memory cells MC and the second half-selected memory cells MC. Therefore, the non-selected memory cells MC and the second half-selected memory cells MC maintain the OFF state. Further, the voltage (voltage Vonk−voltage VUS) is applied to the first half-selected memory cell MC. In the present embodiment, the absolute value of the voltage (voltage Vonk−voltage VUS) does not exceed the voltage Vth. Therefore, the first half-selected memory cell MC maintains the OFF state. The transistors M1 and M27 are designed to supply the selected memory cell MC with the voltage Vonk such that the absolute value of this voltage (voltage Vonk−voltage VUS) does not exceed the voltage Vth.

Then, after the selected memory cell MC transitions to the ON state, the controller 15 sets the signal SON to "H" level. At this time, the voltage of the local bit line LBL connected to the selected memory cell MC becomes the voltage Vonk, and the voltage of the local source line LSL connected to the selected memory cell MC becomes the voltage Vss. As a result, a voltage (voltage Vonk−voltage Vss) is applied to the selected memory cell MC. The transistor M1 is designed such that this voltage (voltage Vonk−voltage Vss) does not fall below the voltage Vhold.

As shown from time T5 onward in FIG. 34, the controller 15 switches the transistor M27 to the ON state in order to switch the selected memory cell MC to the ON state also during the second read operation.

The time for switching the transistor M27 to the ON state is shorter than the time for switching the transistor M1 to the ON state. That is, the time for supplying the voltage from the transistor M27 to the memory cell MC is shorter than the time for supplying the voltage from the transistor M1 to the memory cell MC.

<3-1-3> Effects

As described above, it is possible to appropriately perform a read operation by providing the transistor M27 for reliably switching the selected memory cell MC to the ON state.

This transistor M27 can also be applied to the preamplifier 121 described in the second embodiment.

<3-2> Others

In each of the above-described embodiments, the case where the first example is applied as the configuration of the memory cell MC was described. However, in each of the above-described embodiments, the second example may be applied as the configuration of the memory cell MC, and the same effect as when the first example is applied can be obtained.

Further, in each of the above-described embodiments, the memory system or the semiconductor storage device may be a package.

In addition, the term to be connected in each of the above-described embodiments includes a state in which the term is indirectly connected with something else such as a transistor or a resistor interposed therebetween.

Here, the MRAM that stores data by using a magnetic tunnel junction (MTJ) element as a variable resistance element is described as an example, but the embodiments are not limited thereto.

The embodiments can be applied to a resistance-change type memory similar to MRAM, for example, and also to a semiconductor storage device having an element that stores data by utilizing a resistance change, such as ReRAM and PCRAM, for example.

In addition, by storing data by the resistance change with the application of a current or a voltage, or by converting the resistance difference due to the resistance change into a current difference or a voltage difference, the embodiments can be applied to a semiconductor storage device having an element capable of reading stored data regardless of whether the semiconductor storage device is a volatile memory or a nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell including a switching element and a variable resistance element; and
   a first circuit configured to perform a read operation on the memory cell by:
      switching the memory cell to an ON state,
      performing a first read operation on the memory cell that has been switched to the ON state,
      generating a first voltage based on the first read operation,
      switching the memory cell to the ON state after first data is written to the memory cell on which the first read operation has been performed,
      performing a second read operation while maintaining the memory cell in the ON state when the first data is stored in the memory cell during the first read operation,
      performing the second read operation after the memory cell transitions from the ON state to an OFF state at least once when second data different from the first data is stored in the memory cell during the first read operation,
      generating a second voltage based on the second read operation, and
      determining the data stored in the memory cell during the first read operation based on the first voltage and the second voltage.

2. The semiconductor storage device according to claim 1, wherein
   the memory cell
      transitions from the OFF state to the ON state when an absolute value of a voltage applied to the memory cell exceeds a third voltage, and
      in the ON state, transitions from the ON state to the OFF state when the absolute value of the voltage applied to the memory cell is lower than a fourth voltage.

3. The semiconductor storage device according to claim 2, wherein
   when the second data is stored in the memory cell during the first read operation, the absolute value of the voltage applied to the memory cell is lower than the fourth voltage.

4. The semiconductor storage device according to claim 1, wherein
   the first circuit includes a transistor that supplies a voltage to the memory cell based on the first voltage when switching the memory cell to the ON state after the first data is written to the memory cell.

5. The semiconductor storage device according to claim 1, wherein
   the first circuit repeats transitioning between the ON state and the OFF state when the second data is stored in the memory cell during the first read operation.

6. The semiconductor storage device according to claim 1, further comprising:
   a plurality of local source lines extending in a first direction; and
   a plurality of local bit lines extending in a second direction crossing the first direction,
   wherein the memory cell is connected between one of the local source lines and one of the local bit lines.

7. The semiconductor storage device according to claim 6, wherein the variable resistance element of the memory cell is a magnetic tunnel junction element.

8. The semiconductor storage device according to claim 6, wherein the switching element of the memory cell includes a chalcogen element.

9. A semiconductor storage device comprising:
   a plurality of local source lines extending in a first direction;
   a plurality of local bit lines extending in a second direction crossing the first direction;

a plurality of memory cells, each connected between one of the local source lines and one of the local bit lines and including a switching element and a variable resistance element; and a read circuit configured to perform a read operation on a memory cell by:
- applying voltages to one of the local source lines and one of the local bit lines to select the memory cell,
- switching the selected memory cell to an ON state,
- performing a first read operation on the selected memory cell that has been switched on the ON state,
- generating a first voltage based on the first read operation,
- switching the selected memory cell to the ON state after first data is written to the selected memory cell on which the first read operation has been performed,
- performing a second read operation while maintaining the selected memory cell in the ON state when the first data is stored in the selected memory cell during the first read operation,
- performing the second read operation after the selected memory cell transitions from the ON state to an OFF state at least once when second data different from the first data is stored in the selected memory cell during the first read operation,
- generating a second voltage based on the second read operation, and
- determining the data stored in the selected memory cell during the first read operation based on the first voltage and the second voltage.

10. The semiconductor storage device according to claim 9, wherein
the selected memory cell
- transitions from the OFF state to the ON state when an absolute value of a voltage applied to the selected memory cell exceeds a third voltage, and
- in the ON state, transitions from the ON state to the OFF state when the absolute value of the voltage applied to the selected memory cell is lower than a fourth voltage.

11. The semiconductor storage device according to claim 10, wherein
when the second data is stored in the selected memory cell during the first read operation, the absolute value of the voltage applied to the selected memory cell is lower than the fourth voltage.

12. The semiconductor storage device according to claim 9, wherein
the first circuit includes a transistor that supplies a voltage to the selected memory cell based on the first voltage when switching the selected memory cell to the ON state after the first data is written to the selected memory cell.

13. The semiconductor storage device according to claim 9, wherein
the first circuit repeats transitioning between the ON state and the OFF state when the second data is stored in the selected memory cell during the first read operation.

14. The semiconductor storage device according to claim 9, wherein the variable resistance element of the selected memory cell is a magnetic tunnel junction element.

15. The semiconductor storage device according to claim 14, wherein the switching element of the selected memory cell includes a chalcogen element.

16. A method of performing a read operation on a memory cell of a semiconductor storage device, the memory cell including a switching element and a variable resistance element, said method comprising:
- switching the memory cell to an ON state;
- performing a first read operation on the memory cell that has been switched to the ON state;
- generating a first voltage based on the first read operation;
- after the first read operation, performing a write operation on the memory cell to write first data into the memory cell;
- switching the memory cell to the ON state after the first data is written to the memory cell on which the first read operation has been performed;
- performing a second read operation while maintaining the memory cell in the ON state when the first data is stored in the memory cell during the first read operation;
- performing the second read operation after the memory cell transitions from the ON state to an OFF state at least once when second data different from the first data is stored in the memory cell during the first read operation;
- generating a second voltage based on the second read operation; and
- determining the data stored in the memory cell during the first read operation based on the first voltage and the second voltage.

17. The method according to claim 16, wherein
the memory cell
- transitions from the OFF state to the ON state when an absolute value of a voltage applied to the memory cell exceeds a third voltage, and
- in the ON state, transitions from the ON state to the OFF state when the absolute value of the voltage applied to the memory cell is lower than a fourth voltage.

18. The method according to claim 17, wherein
when the second data is stored in the memory cell during the first read operation, the absolute value of the voltage applied to the memory cell is lower than the fourth voltage.

19. The method according to claim 16, further comprising:
supplying a voltage to the memory cell based on the first voltage when switching the memory cell to the ON state after the first data is written to the memory cell.

20. The method according to claim 16, wherein
the second read operation is performed after the memory cell transitions from the ON state to an OFF state a plurality of times when the second data is stored in the memory cell during the first read operation.

* * * * *